United States Patent
Misra et al.

(10) Patent No.: US 7,642,546 B2
(45) Date of Patent: Jan. 5, 2010

(54) MOLECULAR MEMORY DEVICES INCLUDING SOLID-STATE DIELECTRIC LAYERS AND RELATED METHODS

(75) Inventors: Veena Misra, Apex, NC (US); Ritu Shrivastava, Fremont, CA (US); Zhong Chen, Hefei (CN); Guru Mathur, Tamil Nadu (IN)

(73) Assignees: Zettacore, Inc., Englewood, CO (US); North Carolina State University, Raleigh, NC (US)

( * ) Notice: Subject to any disclaimer, the term of this patent is extended or adjusted under 35 U.S.C. 154(b) by 420 days.

(21) Appl. No.: 11/607,503

(22) Filed: Nov. 30, 2006

(65) Prior Publication Data

US 2007/0164374 A1 Jul. 19, 2007

Related U.S. Application Data

(60) Provisional application No. 60/741,286, filed on Dec. 1, 2005.

(51) Int. Cl.
*H01L 35/24* (2006.01)

(52) U.S. Cl. ............... 257/40; 257/314; 257/E51.007; 257/E51.023; 257/E51.041; 257/E51.044; 977/809; 977/932; 977/936; 977/943

(58) Field of Classification Search ............... 257/40, 257/314, E51.007, E51.023, E51.041, E51.044; 977/809, 932, 936, 943

See application file for complete search history.

(56) References Cited

U.S. PATENT DOCUMENTS

| 5,650,061 A | 7/1997 | Kuhr et al. | |
|---|---|---|---|
| 5,883,397 A | 3/1999 | Isoda et al. | 257/40 |
| 5,923,525 A | 7/1999 | Belyakov et al. | |
| 5,926,412 A | 7/1999 | Evans, Jr. et al. | |
| 6,208,553 B1 | 3/2001 | Gryko et al. | |
| 6,212,093 B1 * | 4/2001 | Lindsey | 365/151 |

(Continued)

FOREIGN PATENT DOCUMENTS

WO  WO 01/03126 A2  1/2001

(Continued)

OTHER PUBLICATIONS

Roth, K. M., Thesis published in 2002, Chapter I overview pp. 1-285.

(Continued)

*Primary Examiner*—Anh Phung
*Assistant Examiner*—Michael Lulis
(74) *Attorney, Agent, or Firm*—Morgan, Lewis & Bockius LLP

(57) ABSTRACT

According to some embodiments, an article of manufacture comprises a substrate; a molecular layer on the substrate comprising at least one charge storage molecule coupled to the substrate by a molecular linker; a solid barrier dielectric layer directly on the molecular layer; and a conductive layer directly on the solid barrier dielectric layer. In some embodiments, the solid barrier dielectric layer is configured to provide a voltage drop across the molecular layer that is greater than a voltage drop across the solid barrier dielectric layer when a voltage is applied to the conductive layer. In some embodiments, the molecular layer has a thickness greater than that of the solid barrier dielectric layer. The article of manufacture contains no electrolyte between the molecular layer and the conductive layer.

43 Claims, 13 Drawing Sheets

U.S. PATENT DOCUMENTS

| | | | |
|---|---|---|---|
| 6,272,038 B1 | 8/2001 | Clausen et al. | |
| 6,290,839 B1 | 9/2001 | Kayyem et al. | |
| 6,324,091 B1 | 11/2001 | Gryko et al. | |
| 6,381,169 B1 | 4/2002 | Bocian et al. | |
| 6,451,942 B1 | 9/2002 | Li et al. | |
| 6,484,394 B1 | 11/2002 | Heo et al. | |
| 6,492,056 B1 | 12/2002 | Ovshinskey | |
| 6,642,376 B2 | 11/2003 | Lindsey et al. | |
| 6,657,884 B2 | 12/2003 | Bocian et al. | |
| 6,674,121 B2 | 1/2004 | Misra et al. | |
| 6,706,473 B1 | 3/2004 | Edman et al. | |
| 6,728,129 B2 | 4/2004 | Lindsey et al. | |
| 6,768,157 B2 | 7/2004 | Krieger et al. | |
| 6,777,516 B2 | 8/2004 | Li et al. | |
| 6,853,472 B2 | 2/2005 | Warner et al. | |
| 6,855,417 B2 | 2/2005 | McCreery | |
| 6,855,950 B2 | 2/2005 | McCreery | |
| 6,921,475 B2 | 7/2005 | Kuhr et al. | |
| 6,944,047 B2 | 9/2005 | Rotenberg et al. | |
| 6,958,270 B2 | 10/2005 | Misra et al. | |
| 7,005,237 B2 | 2/2006 | Lindsey et al. | |
| 7,019,391 B2 | 3/2006 | Tranz | |
| 7,032,277 B2 | 4/2006 | Rolla et al. | |
| 7,042,755 B1* | 5/2006 | Bocian et al. | 365/151 |
| 7,061,791 B2 | 6/2006 | Bocian et al. | |
| 7,074,519 B2 | 7/2006 | Kuhr et al. | |
| 7,253,466 B2* | 8/2007 | Misra et al. | 257/314 |
| 7,307,870 B2* | 12/2007 | Kuhr et al. | 365/151 |
| 7,312,100 B2* | 12/2007 | Bocian et al. | 438/99 |
| 7,324,385 B2* | 1/2008 | Mobley et al. | 365/185.29 |
| 7,358,113 B2* | 4/2008 | Shrivastava et al. | 438/99 |
| 7,518,905 B2* | 4/2009 | Bocian et al. | 365/151 |
| 2001/0010654 A1 | 8/2001 | Shau | |
| 2002/0105897 A1 | 8/2002 | McCreery et al. | |
| 2002/0158295 A1 | 10/2002 | Armgarth et al. | 257/431 |
| 2002/0180446 A1 | 12/2002 | Kuhr et al. | |
| 2003/0081463 A1 | 5/2003 | Bocian et al. | |
| 2003/0082444 A1 | 5/2003 | Kuhr et al. | |
| 2004/0007758 A1 | 1/2004 | McCreery | |
| 2004/0115524 A1 | 6/2004 | Misra et al. | |
| 2004/0150465 A1 | 8/2004 | Nishida et al. | |
| 2004/0151912 A1 | 8/2004 | McCreery | |
| 2005/0062097 A1* | 3/2005 | Misra et al. | 257/324 |
| 2005/0162895 A1* | 7/2005 | Kuhr et al. | 365/151 |
| 2005/0185447 A1* | 8/2005 | Kuhr et al. | 365/151 |
| 2005/0207208 A1 | 9/2005 | Bocian et al. | |
| 2005/0270820 A1 | 12/2005 | Mobley et al. | |
| 2006/0151780 A1* | 7/2006 | Ufert | 257/40 |
| 2006/0170022 A1* | 8/2006 | Ufert | 257/296 |

FOREIGN PATENT DOCUMENTS

| | | |
|---|---|---|
| WO | WO 02/077633 A1 | 10/2002 |
| WO | WO 03/052835 A1 | 6/2003 |
| WO | WO 03/071552 A | 8/2003 |

OTHER PUBLICATIONS

Luyken, R. J., et al., "Concepts for hybrid CMOS-molecular non-volatile memories" Nanotechnology IOP Publishing UK., vol. 14, No. 2, 2003, pp. 273-276.

Kwok, K. S., "Materials for future electronics" *Materials Today, Elsevier Science*, Kidlington, GB, vol. 6, No. 12, Dec. 2003, pp. 20-27.

Gowda, et al., "Hybrid silicon/molecular memories-co-engineering for novel functionality" *International Electron Devices Meeting 2003 IEDM Technical Digest.*, Washington, DC, Dec. 8-10, 2003, New York, NY:*IEEE*, US, pp. 537-540.

Roth K. M., et al. "Measurements of Electron-Transfer Rates of Charge-Storage Molecular Monolayers On Si(100). Toward Molecular/Semiconductor Information Storage Devices", *J. Am. Chem. Soc.; Journal of the American Chemical Society* Jan. 15, 2003, vol. 125, No. 2, Jan. 15, 2003, pp. 505-517.

Gittins, et al., "A nonmetre-scale electronic switch consisting of a metal cluster and redox-addressable groups" *Nature, MacMillan Journals, Ltd.*, London, GB, vol. 408, Nov. 2, 2000, pp. 67-69.

Nishida Y., et al. "An Interpolating Sense Circuit for Molecular Memory", *Department of Electrical and Computer Engineering, CICC 2002*, 4 pp.

Schweikart, K-H, et al., "Design, synthesis, and characterization of prototypical multistate counters in three distinct architectures", *J. Mater. Chem.*, 2002, 12(4), pp. 808-828.

Ccc™ Spincoaters, Brewer Science, http://www.brewerscience.com/cee/products/cee100.html 8 pp.

"Bake Process Theory", *Cost Effective Equipment*, (no. date), 4 pp.

MBraun, Inertgas Technology, MB OX-SE-3 Oxygen Probe, (no date), www.mbraun.com, 4 pp.

"Spin Coat Theory", Cost Effective Equipment, (no date), 6 pp.

"Spin Coating Patent Index", http://www.mse.arizona.edu/faculty/birnie/Coatings/PatenNdx.htm, Apr. 12, 2005, 10 pp.

Primaxx website pages, http://www.primaxxinc.com/products.html, Apr. 12, 2005, 30 pp.

P. Mumbauer, et al. "Mist Deposition in Semiconductor Device Manufacturing", Nov. 1, 2004, http://www.reed-electronics.com/semiconductor/index.asp?layout=articlePrint&articleID=CA476 . . . , 7 pp.

Xiangfeng D., et al. "Nonvolatile Memory and Programmable Logic from Molecule-Gated Nanowires", *Nanoletters* 2(5) (2002), pp. 487-490.

Li, C., et al. "Data Storage Studies on Nanowire Transistors with Self-Assembled Porphyrin Molecules", *J. Phys. Chem. B.* 2004, 108, pp. 9646-9649.

Roth K. M., et al. "Molecular Approach Toward Information Storage Based on the Redox Properties of Porphyrins in Self-Assembled Monolayers", *J. Vac. Sci. Tech. B 2000*, 18, pp. 2359-2364.

Gryko, D., et al., "Synthesis of "Porphyrin-Linker-Thiol", Molecules with Diverse Linkers for Studies of Molecular-Based Information Storage", *J.Org. Chem.* 2000, 65, pp. 7345-7355.

Gryko, D., et al., "Synthesis of Thiol-Derivatized Ferrocene-Porphyrins for Studies of Multibit Information Storage", *J. Org. Chem.* 2000, 65, pp. 7356-7362.

Clausen C.,et al., "Synthesis of Thiol-Derivatized Porphyrin Dimers and Trimers for Studies of Architectural Effects on Multibit Information Storage", *J. Org. Chem.* 2000, 65, pp. 7363-7370.

Clausen C., et al., "Investigation of Tightly Coupled Porphyrin Arrays Comprised of Identical Monomers for Multibit Information Storage," *J.Org. Chem.* 2000,65, pp. 7371-7378.

Li J., "Synthesis of Thiol-Derivatized Europian Porphyrinic Triple-Decker Sandwich Complexes for Multibit Molecular Information Storage", *J. Org. Chem.* 2000, 65, pp. 7379-7390.

Gryko D. et al., "Thiol-Derivatized Porphyrins for Attachment to Electoactive Surfaces", *J. Org. Chem.* 1999,64, pp. 8635-8647.

Gryko, D. "Studies Related to the Design and Synthesis of a Molecular Octal Counter", *J. Mat. Chem.*, 2001, 11(4), pp. 1162-1180.

Roth K. M., et al., Characterization of Charge Storage in Redox SAMs, *Langmuir*, 2002, 18(10): pp. 4030-4040.

Roth K. M., et al., "Comparison of Electron-Transfer and Charge-Retention Characteristics of Porphyrin-Containing Self-Assembled Monolayers Designed for Molecular Information Storage", *J. Phys. Chem. B.*, 2002, 106, pp. 8639-8648.

Liu, Z., et al., "Molecular Memories That Survive Silicon Device Processing and Real-World Operation", *Science* vol. 302, Nov. 28, 2003, pp. 1543-1545.

Roth K. M., "Charge-Retention Characteristics of Self-Assembled Monolayers of Molecular-Wire-Linked Porphyrins on Gold", *American Chemical Society*, 2003, pp. 51-61.

Seth et al., "Investigation of Electronic Communication in Multi-Porphyrin Light-Harvesting Arrays", (1994) *J. Am. Chem.* Soc., 116: pp. 10578-10592.

Seth et al., "Soluble Synthetic Multiporphyrin Arrays. 3. Static Spectroscopic and Electrochemical Probes of Electronic Communication", (1996), *J. Am. Chem. Soc.*, 118: pp. 11194-11207.

Strachan et al. "Effects of Orbital Ordering on Electronic Communication in Multiporphyrin Arrays" (1997), *J. Am. Chem. Soc.*, 119: pp. 11191-11201.

Li et al. "Effects of Central Metal ion (Mg, Zn) and Solvent on Singlet Excited-State Energy Flow in Porphyrin-Based Nanostructures", (1997), *J. Mater. Chem.*, 7: pp. 1245-1262.

Strachan et al. "Synthesis and Characterization of Tetrachlorodiarylethyne-Linked Porphyrin Dimers. Effects of Liner Architecture on Intradimer Electronic Communication" (1998), *Inorg. Chem.*, 37: pp. 1191-1201.

Yang et al. Interplay of Orbital Tuning and Linker Location in Controlling Electronic Communication in Porphyrin Arrays (1999), *J. Am. Chem. Soc.*, 121: pp. 4008-4018.

Roth et al. Molecular Approach Toward Information Storage Based on the Redox Properties of Porphyrins in Self-Assembled Monolayers, (2000) *Vac. Sci. Technol. B 18*: pp. 2359-2364.

Roth et al. "Measurements of Electron-Transfer Rates of Charge-Storage Molecular Monolayers on Si(100). Toward Hybrid Molecular/Semiconductor Information Storage Devices" (2003), *J. Am. Chem. Soc. 125*: pp. 505-517.

Advanced Inorganic Chemistry, 5th Ed., Cotton & Wilkinson, John Wiley & Sons, 1988, chapter 26.

Advanced Organic Chemistry, 5th Edition, Cotton & Wilkenson, John Wiley & Sons, 1988, p. 38.

Organometallics, A Concise Introduction, Elschenbroich et al., 2nd Ed., 1992, VCH.

Comprehensive Organometallic Chemistry II, A Review of the Literature 1982-1994, Abel et al. Ed., vol. 7, Chapters 7, 8, 10 & 11, Pergamon Press.

Robbins et al., "Syntheses and Electronic Structures of Decamethylmetallocenes", (1982), *J. Am. Chem. Soc. 104*: pp. 1882-1893.

Gassman et al., "(Trifluoromethyl) cyclopentadienide: A Powerful Electon-Withdrawing Ligand for Transition-Metal Complexes", (1986), *J. Am. Chem. Soc. 108*: pp. 4228-4229.

Connelly et al., "Chemical Redox Agents for Organometallic Chemistry", *Chem. Rev.* (1996) *96*: pp. 877-910.

Geiger et al., "The Electron-Transfer Reactions of Polynuclear Organotransition Metal Complexes", Advances in Organometallic Chemistry 24: p. 87-130.

Jiang et al. "Double-decker Yttrium(III) Complexes with Phthalocyaninato and Porphyrinato Ligands", J. Porphyrins Phthalocyanines (1999) 3: pp. 322-328.

Arnold et al. "Mixed Phthalocyaninato-Porphyrinato Europium(III) Triple-decker Sandwich Complexes Containing a Conjugated Dimeric Porphyrin Ligand", Chemistry Letters (1999), pp. 483-484.

PCT/US 06/61522 Int'l Search Report and Written Opinion, Mar. 26, 2008.

European Search Report for European Patent Application No. 05779254.1, Aug. 7, 2008.

* cited by examiner

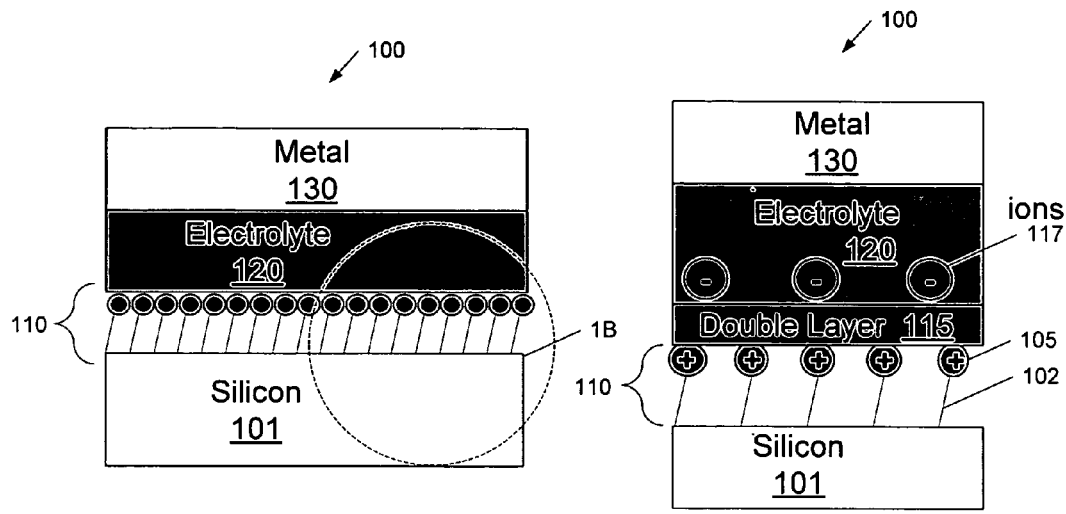
FIG. 1A (Prior Art)
FIG. 1B (Prior Art)
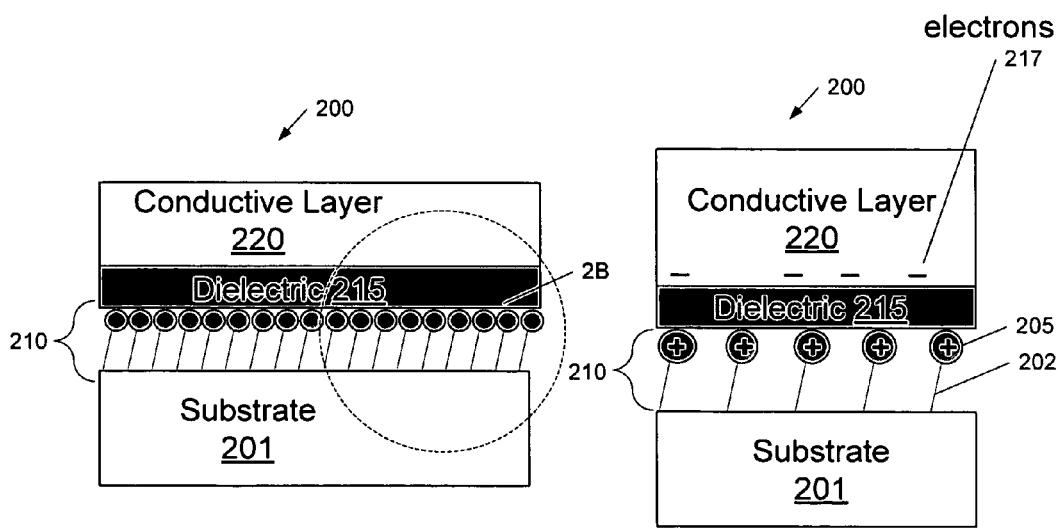
FIG. 2A
FIG. 2B

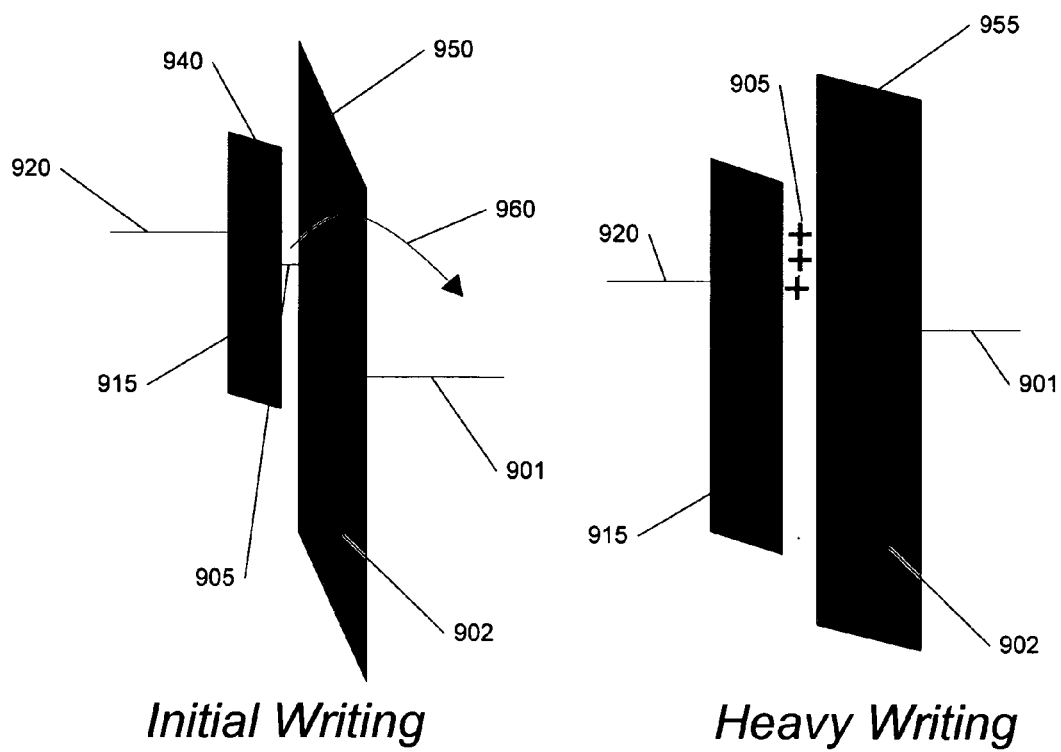
Initial Writing
FIG. 9A
Heavy Writing
FIG. 9B
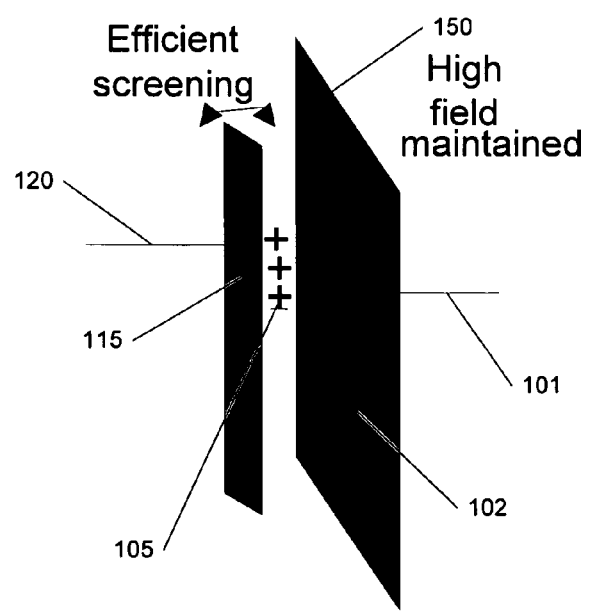
FIG. 9C

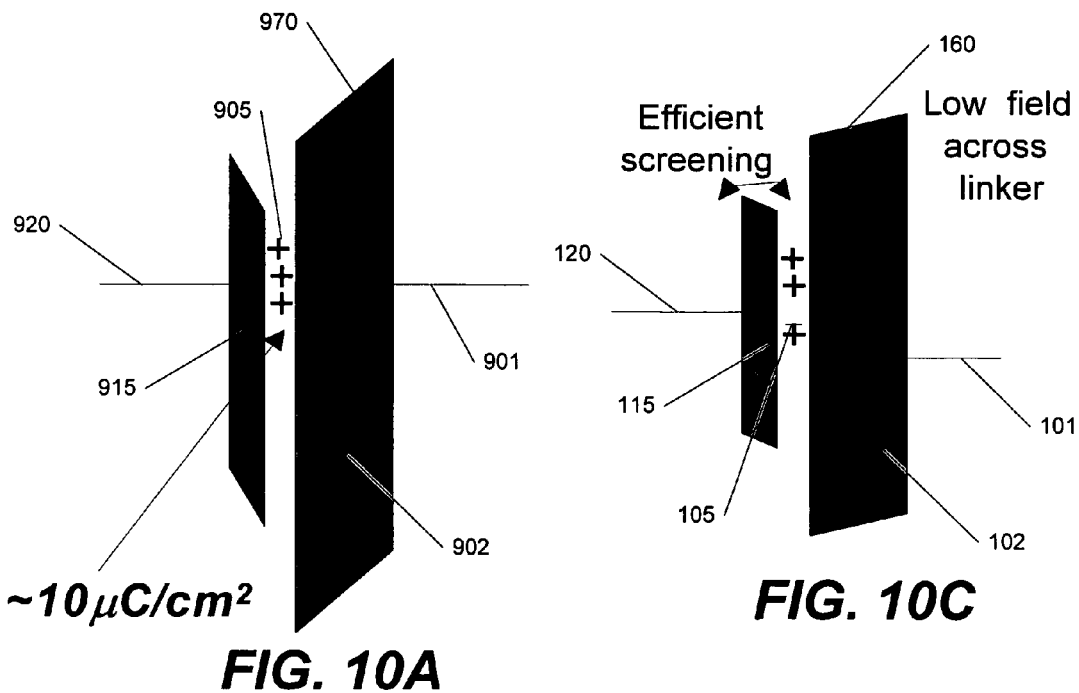
FIG. 10A
FIG. 10C
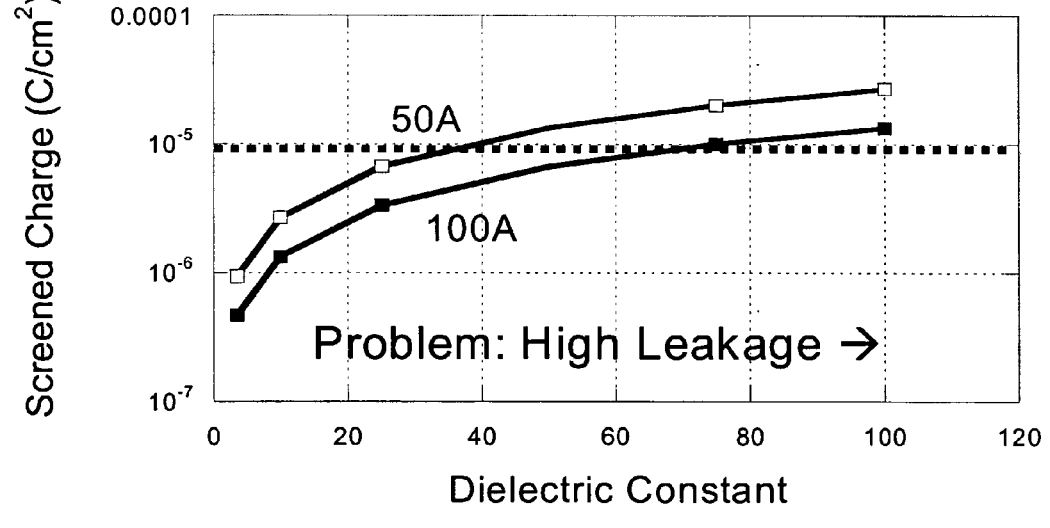
FIG. 10B

MOLECULAR MEMORY DEVICES INCLUDING SOLID-STATE DIELECTRIC LAYERS AND RELATED METHODS

RELATED APPLICATIONS

This application claims the benefit of U.S. Provisional Application No. 60/741,286, filed Dec. 1, 2005; which application is incorporated by reference herein in its entirety.

TECHNICAL FIELD

The present invention relates to memory devices, and more particularly, to molecular memory devices.

BACKGROUND

Traditionally, semiconductor materials, such as silicon, have been used to implement memory circuits. Typically, the semiconductor materials are used in combination with dielectric and conductive materials to fashion transistors, capacitors, resistors, inductors and other basic circuit elements, which are arranged in various combinations to form memory cells and other components of memory devices.

Other types of materials are currently being investigated to replace semiconductor materials in memory devices and other electronics applications, due to the ongoing desire to produce electronic devices with greater information storage density, lower cost, higher speed, and/or other desirable characteristics. Such new materials may include organic molecular materials that can store information by taking on various oxidation states in response to applied signals. Such materials offer potentially higher component density, response speeds, and/or energy efficiency in memory applications.

A variety of approaches have been proposed for molecular memory devices. For example, a hybrid molecular-silicon transistor for use in memory devices and other applications has been proposed. In a hybrid transistor, applying a negative potential between the gate and drain of the molecular transistor may charge a layer of redox-active molecules therein; applying a higher potential may discharge the same molecular layer. Because these "charge-storage" molecules may have at least two possible states (charged or discharged), such a device can be used as a 1-bit memory cell. A logical "1" can be written by charging the redox-active molecules, also called programming. A logical "0" can be written by discharging the redox-active molecules, also called erasing. A logical "0" and/or "1" can be read by sensing a drain-to-source current, which is modulated by the charged state of the redox-active molecules. Programming and erasing typically involves transfer of electrons to and from the molecules, typically by electron tunneling.

In addition, ZettaRAM™ technology is an emerging technology that may replace conventional dynamic random-access memory (DRAM) and other types of memory in computer and/or other memory systems. In ZettaRAM™ technology, the conventional capacitor in a memory cell may be replaced with charge-storage molecules to form a hybrid molecular-silicon capacitor. The amount of charge stored in the capacitor is independent of write voltage. In other words, there is a predetermined threshold voltage above which the device stores a fixed amount of charge, and below which the device discharges the fixed amount of charge. A logical "1" may be written by charging the molecules at a voltage above the threshold voltage (i.e., programming), while a logical "0" may be written by discharging the molecules at a voltage below the threshold voltage (i.e., erasing). In addition, multiple threshold voltages may be provided to enable multi-bit storage. Further description of molecular memory devices can be found in U.S. Pat. No. 7,061,791 to Bocian et al., U.S. Pat. No. 6,212,093 to Lindsey, U.S. Pat. No. 6,272,038 to Clausen et al., U.S. Pat. No. 6,944,047 to Rotenberg et al., U.S. patent application Ser. No. 11/266,776 to Bocian et al., and U.S. patent application Ser. No. 11/118,043 to Mobley et al., the contents of which are incorporated by reference in their entirety.

Hybrid molecular-silicon technology may be important not only in utilizing the advantages of the individual charge-storage molecules, such as discrete energy states, low voltage operation, nano-scale size etc., but also in extending the impact of silicon-based technology. Recently, electrolyte-gated hybrid devices incorporating redox-active molecules have been proposed. FIGS. 1A and 1B illustrate such a hybrid device. More particularly, as shown in FIG. 1A, the device 100 may include a substrate, such as a silicon substrate 101, a molecular layer 110, an electrolyte 120 directly on the molecular layer 110, and a conductive gate, such as a metal gate 130. The electrolyte 120, besides being a conducting medium between the gate 130 and the substrate 101, may also assist in the oxidation and reduction processes of the charge storage molecules in the molecular layer 110 by forming a double layer 115 at the electrolyte-molecule interface, as shown in FIG. 1B. This double layer 115 may be extremely thin (~10 Å), and may behave like an insulator.

More specifically, as illustrated in the enlarged view of FIG. 1B, when a sufficient voltage is applied to the gate 130, the charge storage molecules 105 in the molecular layer 110 (which includes a linker 102 configured to couple the charge storage molecules 105 to the substrate 101) may be positively charged, and oppositely charged ions 117 in the electrolyte 120 across the molecule-electrolyte interface may balance these positive charges. As such, due to the accumulation of charges at the interface, an electrostatic equilibrium is established, resulting in a "double layer" 115 of separated charges. The induced double layer 115 may substantially inhibit leakage between the electrolyte 120 and the charge-storage molecules 105. Further description of electrolyte-gated hybrid devices can be found in U.S. Pat. No. 6,674,121 to Misra et. al and U.S. patent application Ser. No. 10/837,028 to Bocian et al., the contents of which are incorporated by reference in their entirety.

SUMMARY

According to some embodiments of the present invention, a molecular memory cell includes a substrate and a molecular layer on the substrate. The molecular layer may include at least one charge storage molecule coupled to the substrate by a molecular linker. The molecular memory cell further includes a dielectric layer comprising aluminum nitride directly on the molecular layer opposite the substrate, and a conductive gate directly on the dielectric layer comprising aluminum nitride opposite the molecular layer. The dielectric layer comprising aluminum nitride may be configured to provide a barrier to reduce or prevent degradation of the electrical and/or chemical properties of the at least one charge storage molecule during fabrication and/or use of the molecular memory cell as compared to an electrolyte layer.

In some embodiments, the dielectric layer comprising aluminum nitride may be configured to provide a voltage drop across the molecular layer that is greater than a voltage drop across the dielectric layer comprising aluminum nitride when a voltage is applied to the conductive gate. For example, the dielectric layer comprising aluminum nitride may have a greater dielectric constant than the molecular layer. In addition, the molecular layer may have a thickness greater than that of the dielectric layer comprising aluminum nitride. For instance, the molecular layer may have a thickness of about 200 Å, while the dielectric layer comprising aluminum nitride may have a thickness of about 50 Å.

In some embodiments, the at least one charge storage molecule may be at least one redox active molecule. For example, the at least one charge storage molecule may be a porphyrin molecule and/or a ferrocene molecule.

In some embodiments, the substrate may be a semiconductor, a dielectric, a metal, and/or a metal nitride. For example, the substrate may be a silicon substrate. In addition, the conductive gate may be an aluminum gate.

In other embodiments, the substrate may include first and second source/drain regions and a channel region therebetween. The molecular layer may be coupled to the channel region of the substrate to define a solid-state molecular transistor.

According to further embodiments of the present invention, a molecular memory device includes a substrate and at least one charge storage molecule coupled to the substrate by a molecular linker. The at least one charge storage molecule may be configured to store a fixed charge therein and discharge the fixed charge therefrom responsive to a voltage applied thereto. The molecular memory device further includes a solid barrier layer directly on the at least one charge storage molecule opposite the substrate, and a conductive gate directly on the solid barrier layer opposite the at least one charge storage molecule. The solid barrier layer is configured to reduce or prevent degradation of the electrical and/or chemical properties of the at least one charge storage molecule during fabrication and/or use as compared to an electrolyte layer.

In some embodiments, the at least one charge storage molecule may have a dielectric constant of about 2.5, and the solid barrier layer may have a dielectric constant of about 8.5 or more. In addition, the solid barrier layer may have a band gap of about 6 eV or more. In some embodiments, the solid barrier layer is aluminum oxide ($Al_2O_3$), aluminum nitride (AlN), cobalt titanium oxide ($CoTiO_3$), nickel titanium oxide ($NiTiO_3$), hafnium oxide ($HfO_2$), titanium oxide ($TiO_2$), and/or derivatives thereof. In some embodiments, the solid barrier layer is $ZrO_2$, $HfAl_xO_y$, $HfSi_xO_y$, $ZrAl_xO_y$, $ZrSi_xO_y$, $LaAl_xO_y$, $La_2O_3$, $Ta_2O_5$, $TaO_xN_y$, $SrTiO_x$, barium strontium titanate, perovskites, and/or derivatives thereof. In some embodiments, the solid barrier layer is a layered structure, such as $HfO_2$—$Al_2O_3$—$HfO_2$, $Al_2O_3$—$HfO_2$, $Ta_2O_5$—$HfO_2$, $HfO_2$—$Nb_2O_5$, or $ZrO_2$—$Al_2O_3$—$ZrO_2$.

According to still further embodiments of the present invention, a method of fabricating a molecular memory device includes forming at least one charge storage molecule on a substrate, forming a solid-state dielectric layer directly on the at least one charge storage molecule opposite the substrate, and forming a conductive gate directly on the dielectric layer opposite the at least one charge storage molecule. The solid-state dielectric layer is configured to reduce or prevent degradation of the electrical and/or chemical properties of the at least one charge storage molecule during subsequent device processing and/or use as compared to an electrolyte layer.

In some embodiments, the solid-state dielectric layer may be an aluminum nitride layer deposited directly on the at least one charge storage molecule. More particularly, the aluminum nitride layer may be deposited in an ambient that is free of oxygen. For example, aluminum may be reactively sputtered on the substrate in an ambient comprising argon and nitrogen, and the aluminum may be evaporated using a resistive-heated evaporator and a shadow mask.

In other embodiments, in forming the at least one charge storage molecule, a sacrificial oxide layer may be formed on the substrate. The substrate may be a silicon substrate. The sacrificial oxide layer may be etched using a hydrofluoric (HF) solution to expose at least a portion of the substrate, and a silicon dioxide layer may be grown on the substrate. The at least one charge storage molecule may be placed on the substrate in an ambient comprising argon. A temperature of the substrate may be increased for a predetermined time period, and the substrate may be cooled for a second predetermined time period. The substrate may be rinsed using tetrahydrofuran (THF).

According to some embodiments, an article of manufacture comprises a substrate; a molecular layer on the substrate comprising at least one charge storage molecule coupled to the substrate by a molecular linker; a solid barrier dielectric layer directly on the molecular layer; and a conductive layer directly on the solid barrier dielectric layer. The molecular layer has a thickness greater than that of the solid barrier dielectric layer. The article of manufacture contains no electrolyte between the molecular layer and the conductive layer.

According to some embodiments, an article of manufacture comprises a substrate; a molecular layer on the substrate comprising at least one charge storage molecule coupled to the substrate by a molecular linker; a solid barrier dielectric layer directly on the molecular layer; and a conductive layer directly on the solid barrier dielectric layer. The solid barrier dielectric layer is configured to provide a voltage drop across the molecular layer that is greater than a voltage drop across the solid barrier dielectric layer when a voltage is applied to the conductive layer. The article of manufacture contains no electrolyte between the molecular layer and the conductive layer.

According some embodiments, a method comprises forming a molecular layer with at least one charge storage molecule on a substrate, wherein the at least one charge storage molecule is coupled to the substrate by a molecular linker; forming a solid barrier dielectric layer directly on the molecular layer; and forming a conductive layer directly on the solid barrier dielectric layer. The molecular layer has a thickness greater than that of the solid barrier dielectric layer. There is no electrolyte between the molecular layer and the conductive layer.

According some embodiments, a method comprises forming a molecular layer with at least one charge storage molecule on a substrate, wherein the at least one charge storage molecule is coupled to the substrate by a molecular linker; forming a solid barrier dielectric layer directly on the molecular layer; and forming a conductive layer directly on the solid barrier dielectric layer. The solid barrier dielectric layer is configured to provide a voltage drop across the molecular layer that is greater than a voltage drop across the solid barrier dielectric layer when a voltage is applied to the conductive layer. There is no electrolyte between the molecular layer and the conductive layer.

BRIEF DESCRIPTION OF THE DRAWINGS

FIG. 1A is a cross-sectional schematic diagram illustrating a conventional electrolyte-based molecular memory cell.

FIG. 1B is a cross-sectional schematic diagram illustrating an enlarged view of region 1B of the conventional electrolyte-based molecular memory cell of FIG. 1A.

FIG. 2A is a cross-sectional schematic diagram illustrating a molecular memory device according to some embodiments of the present invention.

FIG. 2B is a cross-sectional schematic diagram illustrating an enlarged view of region 2B of the molecular memory device of FIG. 2A according to some embodiments of the present invention.

FIGS. 9A and 9B are energy band diagrams illustrating write mechanisms in a molecular memory device according to some embodiments of the present invention.

FIG. 9C is an energy band diagram illustrating write mechanisms in a conventional electrolyte-based molecular memory device.

FIG. 10A is an energy band diagram illustrating retention mechanisms in a molecular memory device according to some embodiments of the present invention.

FIG. 10B is a graph illustrating expected effects of the dielectric constant and the thickness of the dielectric layer on screened charge in a molecular memory device according to some embodiments of the present invention.

FIG. 10C is an energy band diagram illustrating retention mechanisms in a conventional electrolyte-based molecular memory device.

DESCRIPTION OF EMBODIMENTS

Figure 3:
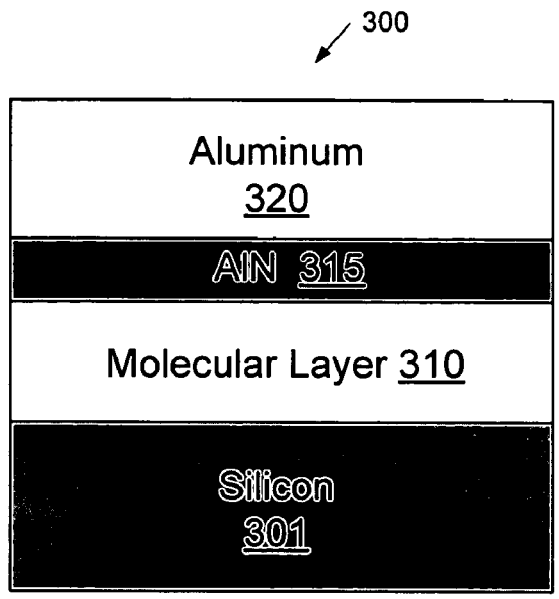
FIG. 3 is a schematic diagram illustrating a molecular memory cell according to further embodiments of the present invention.

The present invention will now be described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention is described below with reference to block diagrams and/or flowchart illustrations of systems, devices, and/or methods according to embodiments of the invention. It should be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Molecular memory devices according to some embodiments of the present invention may be hybrid in nature. In other words, the devices may include elements fabricated using traditional solid-state assembly (e.g. lithography) and methods of synthetic chemistry, e.g., to create the charge-storage molecules. However, some embodiments of the present invention may arise from a realization that a solid-state approach may be desirable for large-scale manufacturing of hybrid technology.

FIGS. 2A and 2B illustrate a molecular memory device according to some embodiments of the present invention. Referring to FIG. 2A, the molecular memory device 200 includes a substrate 201, a molecular layer 210 on the substrate, a solid-state dielectric layer 215 directly on the molecular layer 210 opposite the substrate 201, and a conductive (e.g., metal) gate 220 directly on the dielectric layer 215 opposite the molecular layer 210. The substrate 201 may be a semiconductor, a dielectric, a metal, and/or a metal nitride. As shown in FIG. 2B, the molecular layer 210 includes one or more charge storage molecules 205. The charge storage molecules 205 may be directly coupled to the substrate 201, or, as illustrated in FIG. 2B, may be coupled to the substrate 201 by a molecular linker 202.

The charge storage molecules 205 are configured to store a fixed charge when a voltage is above a predetermined threshold voltage is applied to the molecular layer 210 (for example, via the conductive gate 220). Similarly, the charge storage molecules 205 are configured to discharge the fixed charge when the applied voltage is below the threshold voltage. For example, the charge storage molecules 205 may be redox active molecules, such as porphyrin molecules and/or ferrocene molecules, that are configured to store a fixed charge when the applied voltage is above an oxidation potential for the molecules 205 and discharge the fixed charge when the voltage is below the oxidation potential. It is to be understood that, although discussed herein with reference to a single threshold voltage, the charge storage molecules 205 may be engineered to be charged/discharged above/below various threshold voltages depending on the desired characteristics for a particular application. For example, multiple bits of information can be stored through the use of redox-active molecules that afford one or more distinct oxidation states.

Still referring to FIG. 2B, the linker 202 couples the charge storage molecules 205 to the substrate 201. The linker 202 may be selected such that electron transfer will occur between the charge-storage molecules 205 and the channel of the substrate 201 when an appropriate voltage is placed on the gate 220. The linker 202 may have a physical length and/or conductivity configured such that electrons can pass directly or indirectly between the charge storage molecules 205 and the substrate 201. In addition, the linker 202 may allow for optimization of the electrical characteristics of the molecular memory device 200. More specifically, selection of the linker 202 can alter the charge retention properties of the device 200. For example, leakage of charge from the charge storage molecules 205 may be affected by the energy barrier to electron flow into or out of the channel presented by the linker 202 and/or the distance of electron travel due to the length of the linker 202. In addition, as the electric field applied across the linker 202 is reduced, retention time may be increased. As such, the linker 202 may be selected to provide a predetermined energy barrier and/or physical device dimensions to achieve a desired charge retention time.

The solid-state dielectric layer 215 may be a solid barrier layer that is formed directly on the charge-storage molecules 205 opposite the substrate 201. The dielectric layer 215 may be configured to reduce or prevent degradation of electrical and/or chemical properties of the charge storage molecules 205 during fabrication and/or use of the molecular memory device 200 as compared to a conventional electrolyte layer. More particularly, the dielectric layer 215 may provide a solid barrier to protect porphyrin molecules and/or other charge storage molecules during device manufacturing and/or use, as the charge-storage molecules 205 may be susceptible to oxygen diffusion, extreme temperatures, and/or other environmental conditions in subsequent processing and/or use. The dielectric layer 215 can also be used to facilitate device fabrication, as the dielectric layer 215 may be designed to allow the conductive gate 220 to be placed directly on top of the dielectric layer 215 opposite the molecular layer 210.

The dielectric layer 215 may also be configured to provide a voltage drop across the molecular layer 210 that is greater than a voltage drop across the dielectric layer 215 when a voltage is applied to the conductive gate 220, so that the voltage provided across the charge storage molecules 205 is sufficient to achieve oxidation/reduction. More particularly, the dielectric layer 215 may have a dielectric constant and/or a thickness selected to reduce and/or suppress electron tunneling between the conductive gate 220 and the charge storage molecules 205, so that electron tunneling may occur preferentially between the charge storage molecules 205 and the channel region of the substrate 201. For example, the dielectric layer 215 may be thinner than the molecular layer 210, which may reduce voltage drop across the dielectric layer 215 and thereby increase voltage drop across the molecular layer 210. For example, depending on the charge storage molecules 205 and the dielectric layer 215 used, the molecular layer 210 may have a thickness in the range 20 to 200 Å and the dielectric layer 215 may have a thickness in the range 10 to 50 Å. If the molecular layer 210 has a thickness in the range 20 to 50 Å, the dielectric layer 215 may still be thinner than the molecular layer 210. For example, the molecular layer 210 may have a thickness in the range 30 to 40 Å and the dielectric layer 215 may have a thickness in the range 20 to 30 Å.

In addition, the dielectric layer 215 may have a dielectric constant greater than that of the molecular layer 210. For instance, the dielectric layer 215 may have a dielectric constant of about 8.5 or more, while the molecular layer 210 may have a dielectric constant of about 2.5. As such, a majority of the voltage applied to the conductive gate 220 may be provided across the charge-storage molecules 205, which may allow for reduced gate voltages. Further description of the effects of the dielectric layer on the applied voltage is provided below with reference to FIGS. 6A to 8B.

In some embodiments, the dielectric layer 215 may include aluminum oxide ($Al_2O_3$), aluminum nitride (AlN), cobalt titanium oxide ($CoTiO_3$), nickel titanium oxide ($NiTiO_3$), hafnium oxide ($HFO_2$), titanium oxide ($TiO_2$), and/or derivatives thereof. In some embodiments, the dielectric layer 215 may include $ZrO_2$, $HfAl_xO_y$, $HfSi_xO_y$, $ZrAl_xO_y$, $ZrSi_xO_y$, $LaAl_xO_y$, $La_2O_3$, $Ta_2O_5$, $TaO_xN_y$, $SrTiO_x$, barium strontium titanate, perovskites, and/or derivatives thereof. In some embodiments, the dielectric layer 215 may be a layered structure, such as $HfO_2$—$Al_2O_3$—$HfO_2$, $Al_2O_3$—$HfO_2$, $Ta_2O_5$—$HfO_2$, $HfO_2$—$Nb_2O_5$, or $ZrO_2$—$Al_2O_3$—$ZrO_2$. In addition, the dielectric layer 215 may have a relatively wide band gap, which may reduce leakage current. For example, the dielectric layer 215 may have a band gap of greater than about 6 eV. The band offset may be evenly distributed over the conduction and valence bands.

FIG. 3 illustrates a molecular memory cell according to further embodiments of the present invention. As shown in FIG. 3, a molecular memory cell 300 may include a silicon (Si) substrate 301, a molecular layer 310 on the substrate, an aluminum nitride (AlN) dielectric layer 315 directly on the molecular layer 310 opposite the substrate 301, and an aluminum (Al) gate 320 directly on the dielectric layer opposite the molecular layer 310. The molecular layer 310 may include at least one charge storage molecule, such as a redox-active molecule, coupled to the substrate 301 by a molecular linker.

The aluminum nitride dielectric layer 315 may be configured to provide a barrier to reduce or prevent degradation of electrical and/or chemical properties of the molecular layer 310 during fabrication and/or use of the molecular memory cell 300 as compared to a conventional electrolyte layer. For example, the aluminum nitride dielectric layer 315 may have excellent oxygen diffusion barrier properties, which may provide increased stability for the charge storage molecules in the molecular layer 310. Also, the aluminum nitride dielectric layer 315 may have a thickness that is less than that of the molecular layer 310. For example, the aluminum nitride dielectric layer 315 may have a thickness of about 50 Å, while the molecular layer 310 may have a thickness of about 200 Å.

Accordingly, in some embodiments of the present invention, the double layer induced in a conventional electrolyte-gated device may be replaced by an ultra thin solid-state dielectric layer, such as the aluminum nitride (AlN) dielectric layer 315, to provide a solid-state electronic device incorporating redox-active molecules. The relatively high permittivity of AlN may result in a relatively small voltage drop across the dielectric layer 315, which may allow the charge storage molecules of the molecular layer 310 to be accessed at relatively low voltages. In addition, the discrete multiple energy states which may be provided by redox-active molecules combined with this solid-state approach can be utilized for nano scale memory and logic applications. Moreover, although illustrated in FIG. 3 with reference to aluminum and aluminum nitride, respectively, a wide range of conductive gates and dielectrics may be employed.

Figure 4:
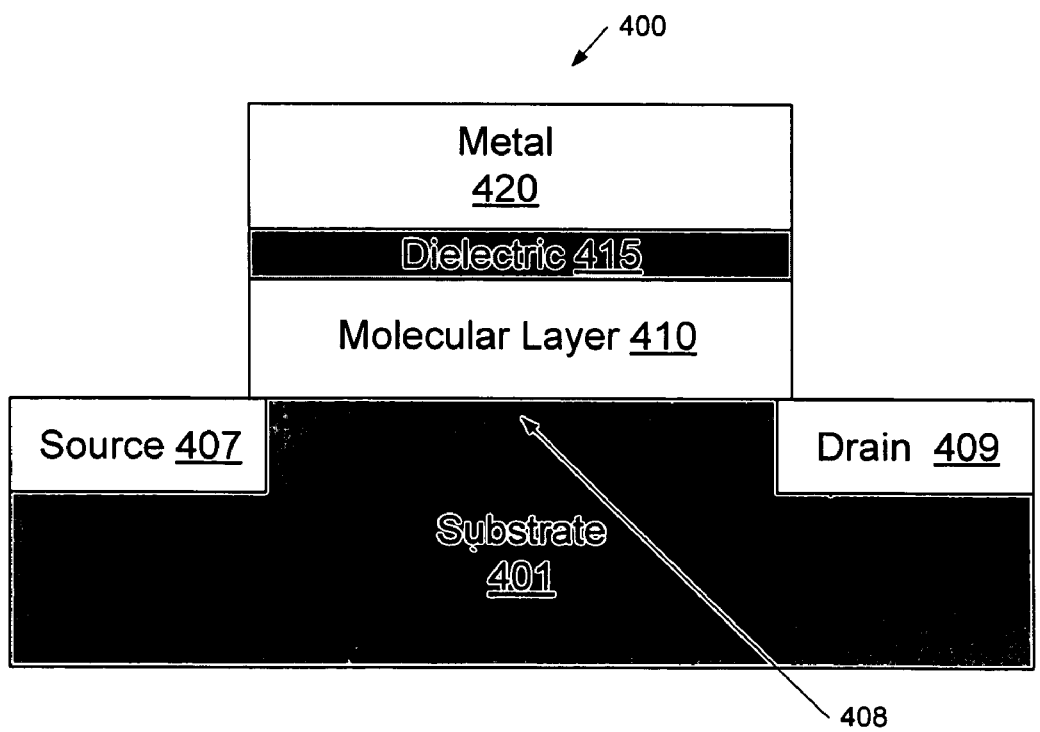
FIG. 4 is a schematic diagram illustrating a molecular transistor according to some embodiments of the present invention.

FIG. 4 illustrates a molecular transistor according to some embodiments of the present invention. As illustrated in FIG. 4, the molecular transistor 400 includes a substrate 401 including a source region 407, a drain region 409, and a channel region 408 therebetween. The molecular transistor further includes a molecular layer 410 on the channel region 408 of the substrate 401, a dielectric layer 415 directly on the molecular layer 410 opposite the substrate 401, and a conductive gate 420 directly on the dielectric layer 415 opposite the molecular layer 410. The molecular layer 410 may include a monolayer of redox-active molecules coupled to the channel region 408 of the substrate 401 by a molecular linker.

Accordingly, the molecular transistor 400 may be similar to a conventional FET, with one or more species of charge-storage molecules arranged on the channel region 408 so that charge can be stored on or removed from the charge storage molecules by an electric field applied at the conductive gate 420. More particularly, an electric potential at the conductive gate 420 may cause charges to be stored in the charge storage molecules of the molecular layer 410. When this electric potential is removed, the charges may remain in the charge storage molecules. The charge storage molecules can store charge in one or more discrete oxidation states, allowing for multi-bit storage. The charges stored in the molecular layer 410 may affect the conductance of the channel region 408 (i.e., the threshold voltage $V_t$ of the device 400), and can thereby be detected by applying a signal across channel region 408, e.g., between source 407 and drain 409. In other words, the charge stored in the charge storage molecules of the molecular layer 410 can be detected by measuring a source-drain current flowing through the transistor 400, analogous to detection in a FLASH memory device.

Figure 5A:
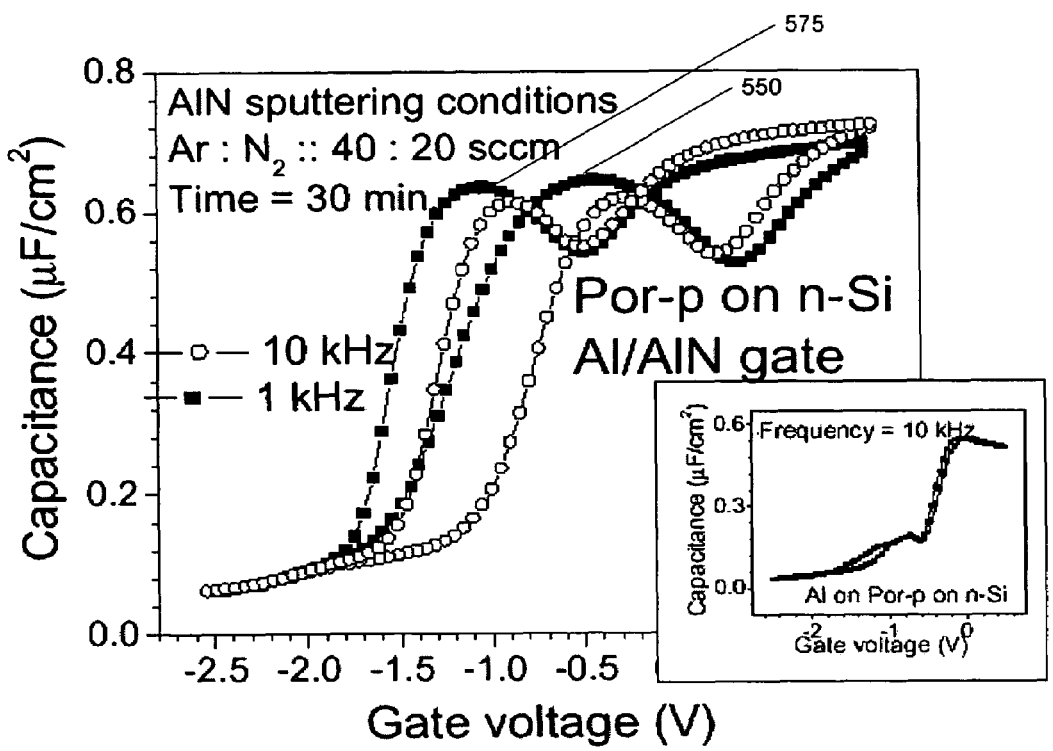
FIGS. 5A and 5B are graphs illustrating capacitance-voltage (CV) characteristics of molecular memory cells according to some embodiments of the present invention.
Figure 5B:
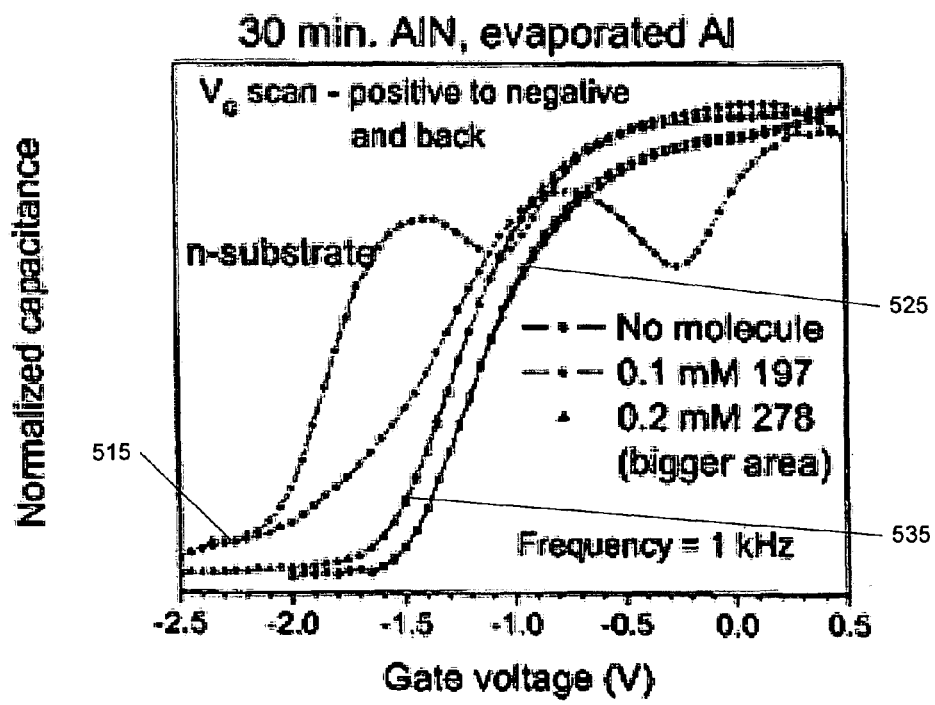

FIGS. 5A and 5B are graphs illustrating capacitance-voltage (CV) characteristics of molecular memory cells according to some embodiments of the present invention. As shown in FIGS. 5A and 5B, CV characteristics are illustrated for porphyrin polymer (Por-p) molecules on an n-type silicon (Si) substrate with an aluminum nitride (AlN) dielectric layer directly on the porphyrin molecules and an aluminum (Al) gate, similar to the device 300 illustrated in FIG. 3. In FIG. 5A, the AlN dielectric layer was formed by reactively sputtering Al in an ambient including argon (Ar) and nitrogen ($N_2$). More particularly, the AlN dielectric layer was formed by sputtering aluminum in an ambient having an argon-nitrogen ratio of about 40:20 sccm for about 30 minutes. Additional possible sputtering conditions are provided in Table 1. As discussed below, the discrete redox states of the molecules may be reserved by the AlN dielectric/barrier layer, as shown by the capacitance and voltage characteristics.

TABLE 1

| | AlN Deposition Conditions | | EOT (Å) | | |
|---|---|---|---|---|---|
| Condition | Argon (sccm) | Nitrogen (sccm) | Native SiO$_2$ | No native SiO$_2$ | Estimated AlN thickness (Å) |
| 1 | 40 | 10 | 38.5 | 34.95 | 79.76 |
| 2 | 10 | 20 | 29.73 | 26.98 | 61.57 |
| 3 | 20 | 20 | 26.98 | 25.85 | 58.99 |
| 4 | 40 | 20 | 20.17 | 20.98 | 46.03 |

Particular experimental results achieved with Al/AlN/n-Si capacitors will now be described with reference to FIGS. 5A and 5B. CV characteristics were measured of an Al/AlN/n-Si capacitor at 1 kHz and 10 kHz, as shown in FIG. 5A, indicating that AlN behaves like a good dielectric. FIG. 5B shows the CV curve of a capacitor 515 with a layer of porphyrin polymer between the AlN dielectric layer and the Si substrate at 1 kHz, as compared to CV curves for capacitors without any molecules 525 and with non-redox molecules 535. The distinct peaks 550 and 575 were observed in the CV characteristics of the sample with redox molecules 515. However, no such peaks were observed for the samples with non-redox molecules 535 or without any molecules 525.

Still referring to FIGS. 5A and 5B, as the gate voltage is swept from negative to positive, the surface of the n-type Si substrate transitions from accumulation to depletion. As the gate voltage reaches the redox voltage of the porphyrin polymer molecules (discrete energy states), the molecules become oxidized and positively charged, thereby resulting in an increase in the capacitance. Once the molecules are oxidized, the Si substrate transitions further into depletion. Furthermore, the presence of positive charges between the AlN dielectric and Si substrate causes the flatband voltage to shift towards more negative values, which can be observed as hysteresis in the CV. On the return scan, two levels of hysteresis are observed, which can be attributed to the two distinct charged states of the porphyrin polymer molecules. When electrolyte was used as a gate on top of the AlN dielectric layer for verification purposes, redox related current peaks were observed for capacitors with porphyrin polymer molecules. This indicates that the redox properties of the porphyrin polymer molecules are preserved even after the deposition of the AlN dielectric layer. Although not shown in FIGS. 5A and/or 5B, these results were further verified by IR spectroscopy data.

In addition, comparative studies between electrolyte and AlN were performed on capacitors employing porphyrin polymer molecules. The AlN capacitors showed CV peaks at frequencies as high as 100 kHz and above, whereas the electrolyte capacitors showed peaks only up to 1 kHz. This indicates that the AlN capacitors may be faster than conventional electrolyte-based capacitors. Furthermore, the AlN capacitors were also found to endure more number of CV cycles than the electrolyte-based capacitors.

This solid-state approach was also incorporated in hybrid silicon MOSFETs with redox-active porphyrin polymer molecules, such as the molecular memory device 400 of FIG. 4. The MOSFET device characteristics were observed to be similar to that of conventional hybrid MOSFETS having an electrolyte gate. The hysteresis and the modulation of the drain current in these devices were also similar to those observed in electrolyte-gated MOSFETs with a monolayer of ferrocenes.

FIGS. 6A to 8B are graphs illustrating expected (i.e., calculated) effects of dielectric constant and thickness of the molecular and dielectric layers on the electric field intensity and voltage applied thereto. Some embodiments of the present invention may provide a solid dielectric layer configured to substantially inhibit leakage (i.e., such that conduction from the gate through the dielectric may be reduced) and configured to provide a voltage drop across the molecular layer that is greater than a voltage drop across the dielectric layer (such that electron tunneling may occur preferentially between the molecular layer and the channel region of the substrate). More particularly, when a voltage is applied to a conductive gate of a molecular memory device, such as the molecular memory cell 200 of FIG. 2B, a portion of the applied voltage may be applied across the dielectric layer, while the remainder may be applied across the molecular layer to induce oxidation/reduction of the charge storage molecules therein. In other words, a voltage divider effect (where the distribution of the applied voltage between the molecular and dielectric layers is relatively large) may be observed based on the characteristics of the molecular and dielectric layers. If too much voltage is provided across the dielectric layer, the applied voltage may be insufficient to achieve oxidation/reduction of charge storage molecules in the molecular layer. As such, it may be desirable to reduce and/or minimize the voltage drop across the dielectric layer to narrow the voltage distribution and thereby reduce the total voltage that may be required to achieve oxidation/reduction of the charge storage molecules in the molecular layer.

Figure 6A:
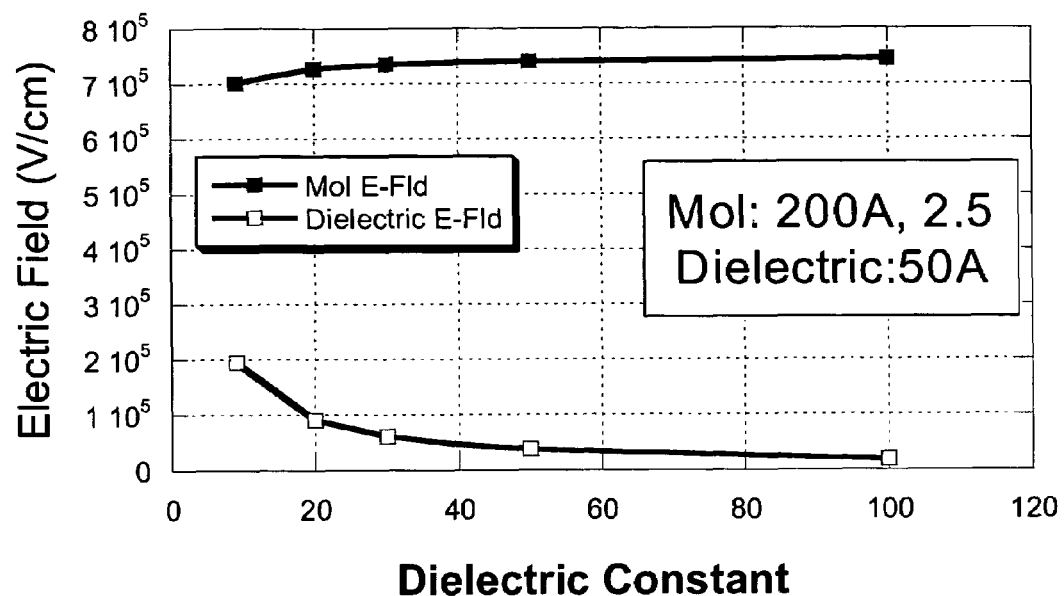
FIGS. 6A and 6B are graphs illustrating expected effects of the dielectric constant of the dielectric layer on the voltage applied to the molecular layer and to the dielectric layer in a molecular memory device according to some embodiments of the present invention.
Figure 6B:
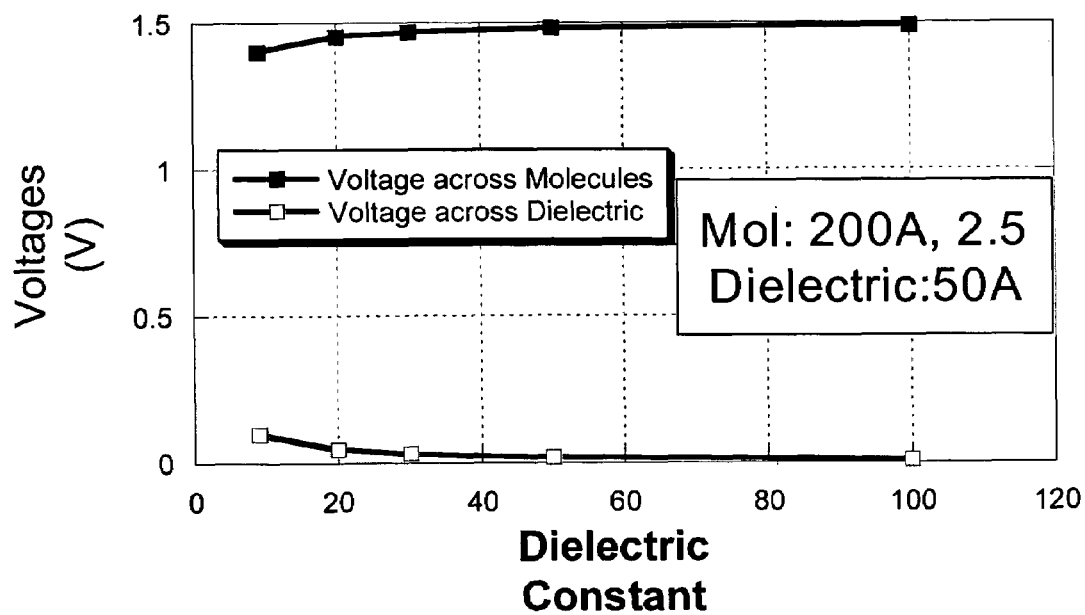

FIGS. 6A and 6B illustrate expected effects of the dielectric constant of the dielectric layer on the voltage applied to a molecular layer and a dielectric layer in a molecular memory device according to some embodiments of the present invention. The dielectric layer has a thickness of about 50 Å, and the molecular layer has a thickness of about 200 Å. In addition, the dielectric constant of the dielectric layer is greater than the dielectric constant of the molecular layer. As shown in FIGS. 6A and 6B, as the dielectric constant of the dielectric layer is increased, the electric field intensity and voltage drop across the molecular layer is increased, while the electric field intensity and voltage drop across the dielectric layer is reduced. In other words, the electric field intensity and/or voltage drop across the molecular layer may be increased by increasing the relative difference between the dielectric constants of the dielectric layer and the molecular layer. For example, as an AlN dielectric layer has a relatively high dielectric constant (8.5-9.4) compared to that of the molecular layer (2.5), an increased electric field and voltage may be provided across the molecular layer.

Figure 7A:
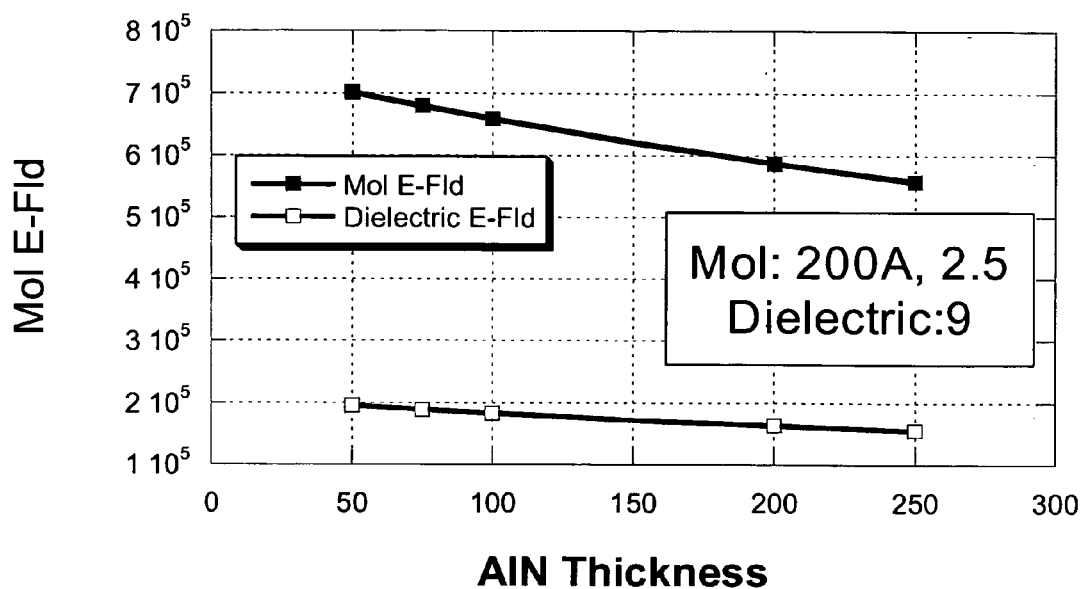
FIGS. 7A and 7B are graphs illustrating expected effects of the thickness of an aluminum nitride (AlN) dielectric layer on the voltage applied to the molecular layer and to the dielectric layer in a molecular memory device according to some embodiments of the present invention.
Figure 7B:
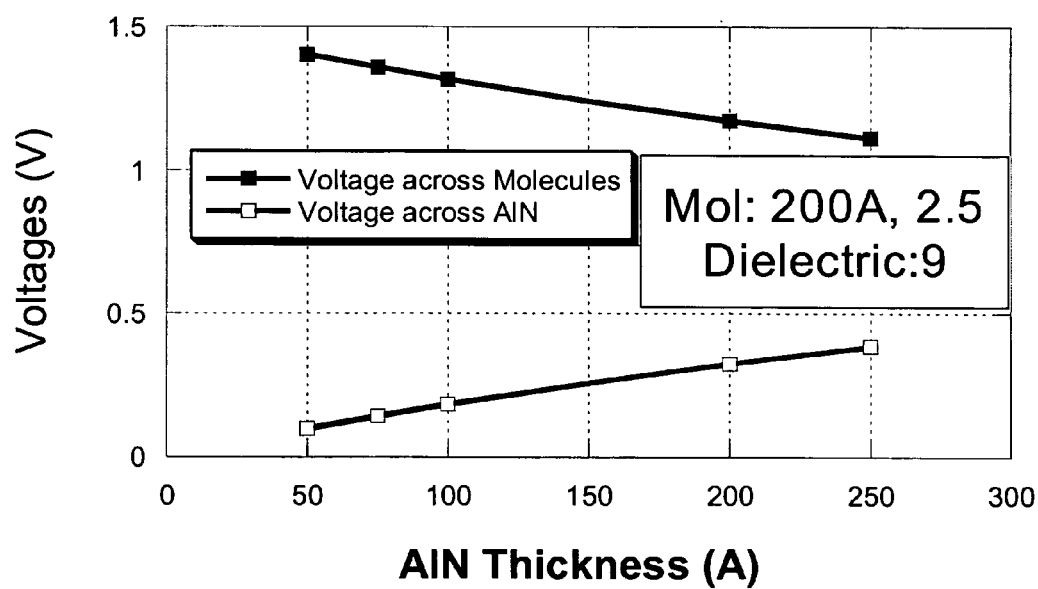

FIGS. 7A and 7B illustrate expected effects of the thickness of an aluminum nitride (AlN) dielectric layer on the voltage applied to the molecular layer and to the dielectric layer in a molecular memory device according to some embodiments of the present invention. More particularly, FIGS. 7A and 7B illustrate the effects as the thickness of the AlN dielectric layer is increased from about 50 Å to about 250 Å, while the thickness of the molecular layer is maintained at about 200 Å. The molecular layer has a dielectric constant of about 2.5, while the AlN dielectric layer has a dielectric constant of about 9. As shown in FIGS. 7A and 7B, the electric field intensity and voltage drop across the molecular layer is reduced as the thickness of the AlN dielectric layer is increased. In other words, when the dielectric layer is relatively thin (50 Å) compared to the thickness of the molecular layer (200 Å), an increased electric field and voltage across the molecular layer may be provided. However, the dielectric layer may be sufficiently thick to substantially inhibit leakage current, e.g. between the gate and the molecular layer.

Figure 8A:
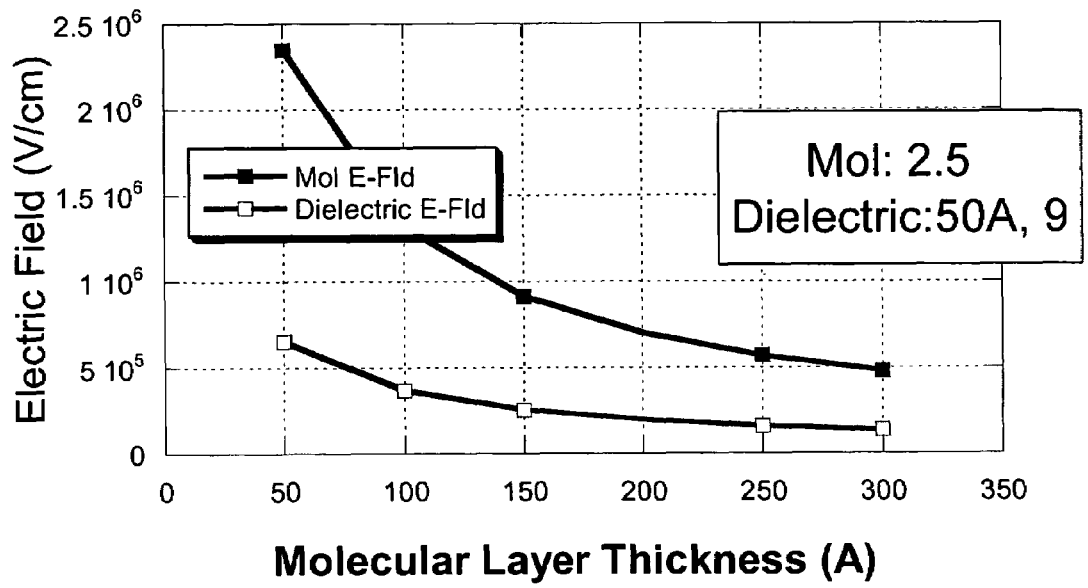
FIGS. 8A and 8B are graphs illustrating expected effects of the thickness of the molecular layer on the voltage applied to the molecular layer and to an aluminum nitride dielectric layer in a molecular memory device according to some embodiments of the present invention.
Figure 8B:
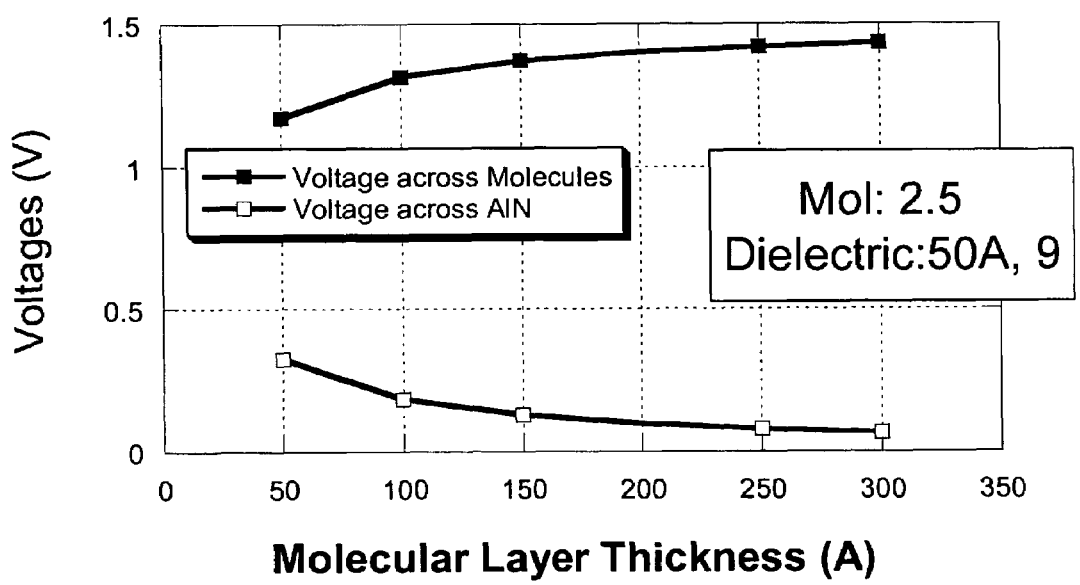

FIGS. 8A and 8B illustrate expected effects of the thickness of the molecular layer on the voltage applied to the molecular layer and to an aluminum nitride dielectric layer in a molecular memory device according to some embodiments of the present invention. More particularly, FIGS. 8A and 8B illustrate the effects as the thickness of the molecular layer is increased from about 50 Å to about 300 Å, while the thickness of the dielectric layer is maintained at about 50A. The molecular layer has a dielectric constant of about 2.5, while the AlN dielectric layer has a dielectric constant of about 9. As shown in FIG. 8B, the voltage drop across the molecular layer is increased as the thickness of the molecular layer is increased. In other words, when the molecular layer is relatively thick (300 Å) compared to the thickness of the dielectric layer (50 Å), an increased voltage drop across the molecular layer may be provided. In addition, due to the increased thickness, the electric field intensity across the molecular layer (measured in V/cm) is reduced, as shown in FIG. 8A.

Accordingly, as illustrated in FIGS. 7B and 8B, the thickness of the dielectric layer relative to that of the molecular layer may affect the voltage applied across the molecular layer. More particularly, the molecular layer may have a thickness that is greater than that of the dielectric layer to provide a more narrow voltage distribution (with a majority of the voltage applied across the molecular layer), so that the total voltage required for oxidation/reduction of the charge storage molecules in the molecular layer may be reduced. In other words, the overall voltage applied to the conductive gate may be reduced by reducing thickness of the dielectric layer relative to that of the molecular layer, so that the portion of the overall voltage that is applied across charge storage molecules is sufficient to achieve oxidation/reduction.

FIGS. 9A and 9B are energy band diagrams illustrating write mechanisms in a molecular memory device according to some embodiments of the present invention. FIGS. 10A and 10B illustrate retention mechanisms in a molecular memory device according to some embodiments of the present invention. FIGS. 9C and 10C respectively illustrate write and retention mechanisms in a conventional electrolyte-gated molecular memory device.

Referring now to FIGS. 9A and 9B, the molecular memory device includes a counter electrode 920 (which may correspond to the conductive gate 320 of FIG. 3), an aluminum nitride dielectric layer 915, charge storage molecules 905, and a molecular linker 902 coupling the charge storage molecules 905 to a working electrode 901 (which may correspond to the silicon substrate 301 of FIG. 3). The dielectric layer 915 and the molecular linker 902 may act as a screening medium for the charge stored in the charge storage molecules 905. The respective slopes 940 and 950 of the dielectric layer 915 and the linker 902 illustrate the magnitude of the electric field respectively applied thereto when a predetermined voltage is applied to the counter electrode 920. More particularly, FIG. 9A illustrates that, during initial writing, a greater electric field may be applied across the linker 902 than to the dielectric layer 915 (illustrated by the slopes 950 and 940). As such, electron tunneling may occur preferentially between the charge storage molecules 905 and the substrate 901 (indicated by the arrow 960). However, FIG. 9B illustrates that, during heavy writing, the electric field applied across the linker 902 may be reduced (indicated by the reduced slope 955), which may reduce the speed of the writing process.

In contrast, FIG. 9C illustrates an energy band diagram for a conventional electrolyte-gated molecular memory device, including a counter electrode 120, an induced double layer 115, charge storage molecules 105, and a molecular linker 102 coupling the charge storage molecules 105 to a substrate 101. As shown in FIG. 9C, during heavy writing, the magnitude of the electric field across the linker 102 may be maintained (illustrated by the slope 150 of the linker 102). In other words, the charge may effectively be screened by the ions across the induced double layer 115 as the charge storage molecules 105 are written, thereby allowing most molecules 105 to be written.

FIGS. 10A to 10C illustrate retention of charge in molecular memory devices according to some embodiments of the present invention and in conventional electrolyte-gated molecular memory devices. The charge-retention time of a molecular memory device may depend on the stability of stored charges in the charge storage molecules and the barrier to electron transfer from the charge storage molecules. As discussed above, the barrier to electron transfer may be determined by both the characteristics of the dielectric layer between the charge storage molecules and the gate, and the characteristics of the molecular linker between the charge storage molecules and the substrate.

Referring now to FIG. 10A, in a molecular memory device according to some embodiments of the present invention, the positive charge in the molecules 905 may be partially screened by the counter electrode 920 and partially by the working electrode 901. The degree of screening may depend on the dielectric constant and the thickness of the dielectric layer 915, as illustrated in FIG. 10B. More particularly, in order to screen a charge of 10 $\mu C/cm^2$, FIG. 10B illustrates that a 50 Å-thick dielectric layer may require a dielectric constant of about 40, while a 100 Å-thick dielectric layer may require a dielectric constant of about 70. As shown in FIG. 10A, where the dielectric layer 915 is aluminum nitride, a relatively high electric field may be applied across the linker 902 (indicated by the slope 970). As such, charge-retention time may be reduced.

However, as shown in FIG. 10C, in a conventional electrolyte-gated molecular memory device, most of the positive charge may be compensated by the counter electrode 120 via the double layer 115, resulting in a relatively small electric field across the linker 102 (indicated by the reduced slope 160).

Figure 11:
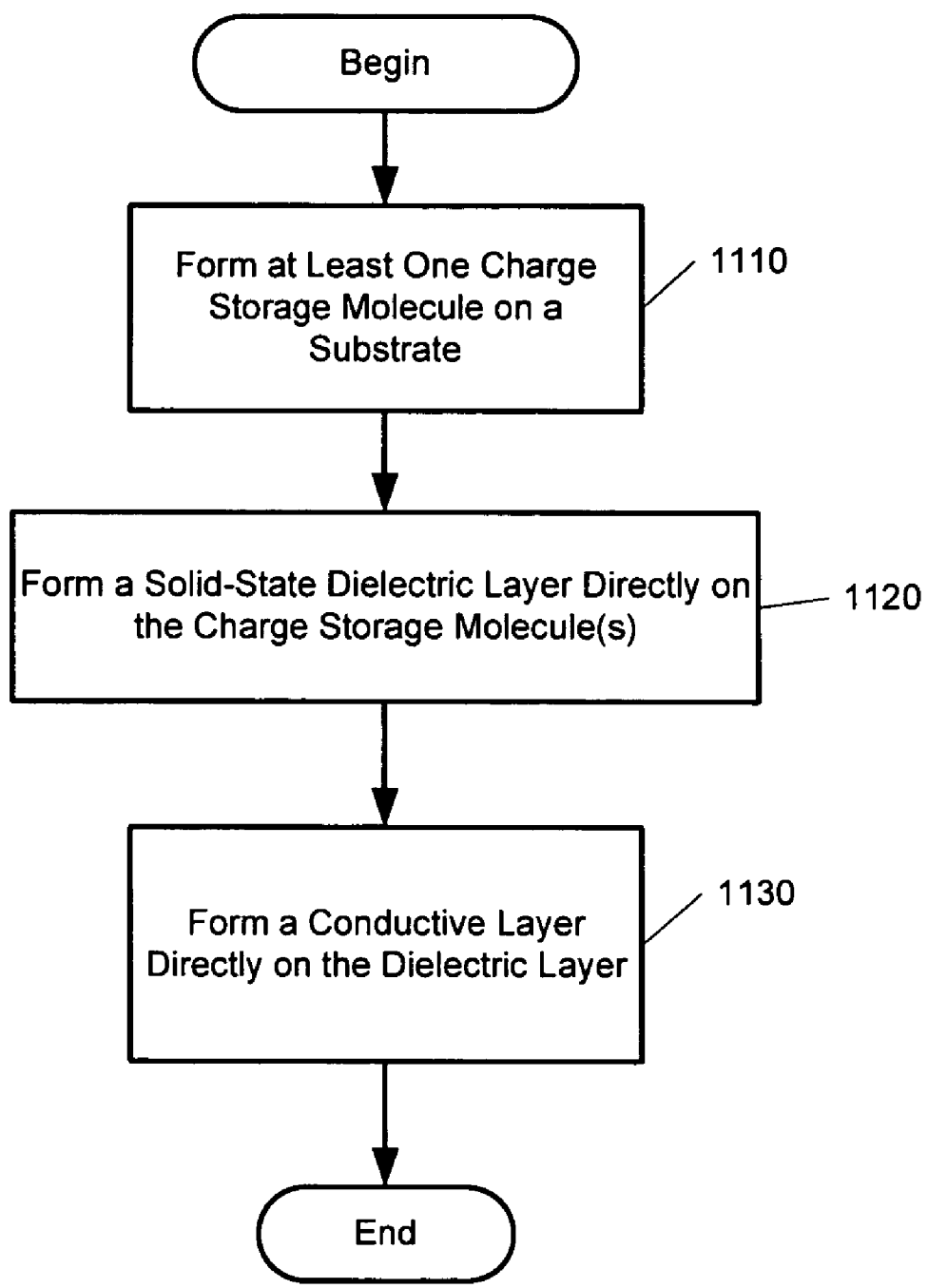
FIGS. 11 and 12 are flowcharts illustrating exemplary fabrication operations in methods of fabricating molecular memory devices according to some embodiments of the present invention.

FIG. 11 is a flowchart illustrating exemplary operations for fabricating a molecular memory device according to some embodiments of the present invention. Referring now to FIG. 11, operations begin at block 1110 when at least one charge storage molecule is formed on a substrate. The substrate may be a semiconductor, a dielectric, a metal, and/or a metal nitride (e.g., TiN). In some embodiments, a TiN layer is deposited on tungsten plugs, which, in turn, may be deposited on an underlying connecting metal. The TiN substrate may be planarized using chemical mechanical polishing (CMP).

The charge storage molecule(s) may be redox active molecules, such as porphyrin and/or ferrocene molecules. The charge storage molecule(s) may be formed by conventional methods (e.g., as described in U.S. Pat. No. 6,212,093 to Lindsey, U.S. Pat. No. 6,272,038 to Clausen at al., U.S. Pat. No. 6,324,091 to Gryko et al., U.S. Pat. No. 6,642,376 to Lindsey et al., U.S. Pat. No. 6,728,129 to Lindsey at al., U.S. Pat. No. 6,924,375 to Lindsey et al., U.S. Pat. No. 7,022,862 to Lindsey et al., U.S. Pat. No. 7,042,755 to Bocian et al., U.S. patent application Ser. No. 10/456,321 to Yu et al., U.S. Pat. No. 6,777,516 to Li et al., U.S. patent application Ser. No. 10/698,255 to Lindsey et al., U.S. patent application Ser. No. 10/867,512 to Lindsey, U.S. patent application Ser. No. 10/872,321 to Lindsey et al., U.S. patent application Ser. No. 10/886,816 to Lindsey et al., U.S. patent application Ser. No.

11/020,901 to Lindsey et al., U.S. patent application Ser. No. 11/192,934 to Lindsey et al., and U.S. patent application Ser. No. 11/193,562 to Lindsey et al.). The charge storage molecule(s) may be coupled to the substrate by a molecular linker, as described above and in U.S. Pat. No. 6,943,054 to Bocian et al., U.S. patent application Ser. No. 11/140,011 to Bocian et al., and U.S. patent application Ser. No. 10/742,596 to Bocian et al., the contents of which are incorporated by reference in their entirety.

Because organic molecules have a low dielectric constant (e.g., k~2), the thickness of the layer of charge storage molecules on the substrate should be minimized to keep the applied external voltage as small as possible. The thickness is a function of molecule design (e.g., monomers vs. polymers), and the processing substrate topology (e.g., a flat bottom topology will minimize the molecule thickness when deposited using a spin process).

A variety of processes can be used to deposit the charge storage molecules (e.g., liquid dispensing of molecules in a solvent via a spin/bake process, or vapor phase processing that may require molecules to be carried via a liquid injection system). For example, after a dry etch preclean (e.g., at 80 W, 10 mT with $CF_4$) and a post etch rinse (e.g., with PGMEA), 1 mM/l of 5-[4-(hydroxymethyl)phenyl]-10,15,20-tri-[3,5-diferrocenyl phenyl]porphinatozinc(II), a ferrocene-appended porphyrin with an alcohol linker, in an organic solvent (e.g., 1-methoxy-2-propanol acetate, known as PGMEA) may be spun onto a TiN substrate at 350 rpm for 2 minutes, followed by a 350° C. bake for 4 minutes in an inert (e.g., nitrogen) ambient. The samples may then be cleaned with PGMEA and the system purged until the samples are completely dry.

A solid-state dielectric layer is formed directly on the charge storage molecule(s) opposite the substrate at block 1120. In some embodiments, the solid barrier dielectric layer (e.g., AlN) is formed by a sputtering process. The solid-state dielectric layer is configured to reduce or prevent degradation of electrical and/or chemical properties of the at least one charge storage molecule during fabrication and/or use of the molecular memory device as compared to an electrolyte layer. For example, the dielectric layer may be an aluminum nitride layer configured to provide a solid barrier to protect the charge storage molecules from oxygen diffusion, extreme temperatures, and/or other conditions in subsequent device processing and/or use. As such, the dielectric barrier layer may allow for increased stability of the charge storage molecules. However, it should be noted that because porphyrin molecules and/or other charge storage molecules may be susceptible to high temperatures, high temperature steps may be performed prior to placement of the charge storage molecules in some embodiments.

The solid barrier dielectric layer thickness should be as thin as possible to allow a high electric field for oxidation and reduction of the charge storage molecules, while keeping the electrical leakage as small as possible. The solid barrier dielectric layer thickness is preferably less than 30 Å. Electrical leakage should be less than $1E-6$ $A/cm^2$, is preferably less than $1E-7$ $A/cm^2$, and is most preferably less than $1E-8$ $A/cm^2$.

In some embodiments, the solid barrier dielectric layer (e.g., $HfO_2$) is formed by atomic layer deposition (ALD). To preserve the charge storage capability of the charge storage molecules, the precursors used in the ALD process should not damage the charge storage molecules. $HfO_2$ and $ZrO_2$ are exemplary high-k dielectric species for the solid barrier dielectric layer, although other high-k dielectric species may be used. The processing temperature is preferably less than 200° C. The ALD temperature is chosen such that the charge storage molecule integrity is preserved. Depending on the charge storage molecule used, the usable temperature range may be quite wide, e.g., from 50 to 500° C. ALD parameters such as pulse time and purge time are optimized for a given process.

For example, a $HfO_2$ solid barrier dielectric layer may be formed by ALD using tetrakis(dimethylamido)Hafnium and $H_2O$ precursors. The samples may be heated to 85° C. and long purge times (~90 sec) may be used. 30 ALD cycles may be used to obtain a ~45 Å thick $HfO_2$ layer, as may be indicated by cross-section transmission electron microscope images.

In some embodiments, if the ALD process uses a low temperature to preserve the charge storage molecules, adequate annealing of the solid barrier dielectric layer may not occur. Thus, an annealing step may follow the ALD deposition to reduce electrical leakage in the solid barrier dielectric layer. In some embodiments, this annealing is done via rapid thermal annealing at a temperature that is high enough to remove residual moisture (or other impurities) and stresses that may build up in the solid barrier dielectric layer, yet which is low enough to preserve the integrity of the charge storage molecules. In some embodiments, an annealing temperature of about 250° C. is used.

Still referring to FIG. 11, a conductive gate is formed on the dielectric layer opposite the charge storage molecule(s) at block 1130. As the dielectric layer provides a solid protective barrier on the charge storage molecule(s), the conductive gate is formed directly on the dielectric layer, which may facilitate device fabrication. Accordingly, a completely solid-state electronic device incorporating charge storage molecules is provided.

The conductive layer may be formed by a variety of processes such as evaporation, physical vapor deposition such as sputtering, chemical vapor deposition, or a metal ALD process. For example, an aluminum layer may be thermally evaporated directly onto the solid barrier dielectric layer. As another example, a Ag layer may be sputtered directly onto the solid barrier dielectric layer. The conductive layer may be a single layer or combination of layers, such as Ag: 1000 Å at 30 W DC, Ag: 750 Å at 150 W pulsed DC, and Al: 200 Å at 75 W DC.

The conductive layer formation process should not adversely affect the charge storage molecules and the solid barrier dielectric layer interface. The parameters chosen for the process should not damage the charge storage molecules. Processing conditions such as the power used for sputtering may damage the molecules.

The conductive layer may be made from materials such as Al, Ti, and Ta. Conductive layers with high work function materials (e.g., Ru, TiN, W, Pt, Mo, WN, MoN, $RuO_2$, $IrO_x$, Re, Os, or TaN) may be used because such layers reduce electrical leakage.

All of the interfaces between different materials in the molecular memory device should be free from native oxide and other contamination or impurity layers. This may require very short queue times between processes, inert environments during process transfer (such as inert gas wafer storage/pod transfer, or SMIF enabled equipment), or cluster tool-based processing to allow processing without exposing the wafer surface to contaminants.

Figure 12:
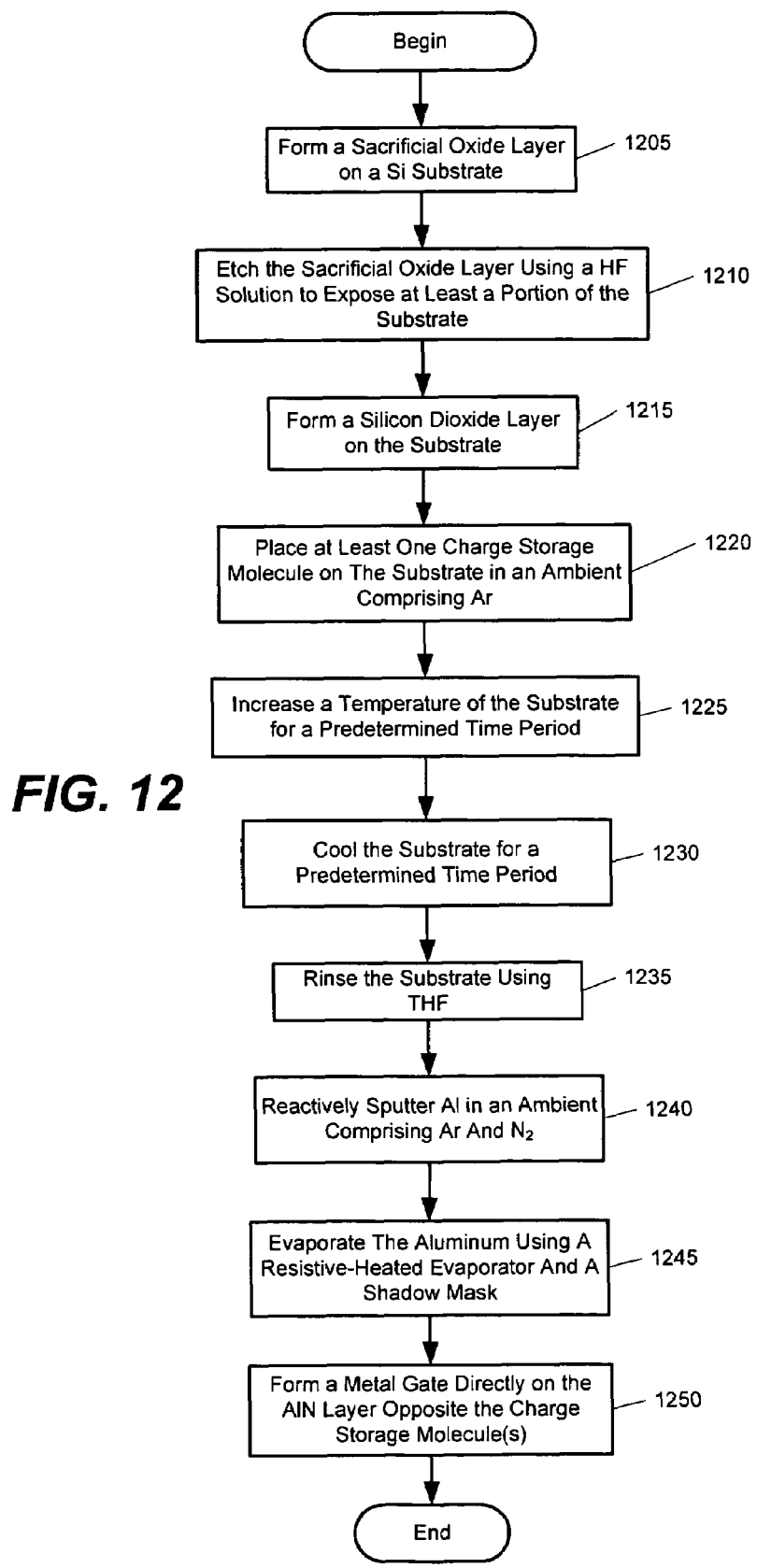

FIG. 12 is a flowchart illustrating operations for fabricating a molecular memory device according to further embodiments of the present invention. As shown in FIG. 12, operations begin when a sacrificial oxide layer is formed on a silicon (Si) substrate at block 1205. For example, the sacrificial oxide layer may be a dummy layer whose function is to remain in place until most or all high-temperature fabrication steps are performed. The sacrificial oxide layer is etched using a hydrofluoric (HF) solution to expose at least a portion of the substrate at block 1210, and a silicon dioxide ($SiO_2$) layer is formed on the exposed substrate at block 1215. The $SiO_2$ layer may be grown on the substrate, for example, using an epitaxial growth process.

Still referring to FIG. 12, the substrate is placed in an ambient comprising argon (Ar), and at least one charge storage molecule is placed on the substrate at block 1220. The charge storage molecules and supporting materials may be formed at relatively lower temperatures. The charge storage molecule(s) may be self-assembling. For example, the charge storage molecule(s) may be redox active molecules assembled to form a monolayer on the silicon substrate. In certain embodiments, the charge storage molecule(s) may be attached to the substrate by a molecular linker. After placing the charge storage molecule(s) at block 1220, a temperature of the substrate is increased for a predetermined time period at block 1225, and the substrate is cooled for a second predetermined time period at block 1230. The substrate is rinsed using tetrahydrofuran (THF) at block 1235, for example to remove any charge storage molecules from undesired regions. Accordingly, a molecular layer including one or more charge storage molecules is formed on the silicon substrate.

An aluminum nitride dielectric layer is deposited directly on the charge storage molecule(s). More particularly, aluminum (Al) is reactively sputtered in an ambient including argon (Ar) and nitrogen ($N_2$) at block 1240. The ambient does not contain oxygen, which may be beneficial in preserving the electrical and/or chemical properties of the charge storage molecule(s). The aluminum is evaporated using a resistive-heated evaporator and/or a shadow mask at block 1245. As such, an aluminum nitride (AlN) layer is deposited directly on the charge storage molecules to form a solid barrier layer. A conductive gate is then formed directly on the AlN layer at block 1250, as described above. In addition, as understood by those of skill in the art, a molecular memory device according to embodiments of the present invention as described above may be formed on a wafer of substrate material simultaneously with thousands or millions of similar and/or identical devices (e.g., using known thin film lithographic processing techniques).

According to some embodiments of the present invention, an electrolyte-induced double layer in a molecular memory cell may be replaced with a solid dielectric layer, such as an ultra thin aluminum nitride (AlN) dielectric layer. The dielectric layer may be configured to provide a solid barrier directly on the molecular layer of the molecular memory cell, to preserve electrical and/or chemical properties of the charge storage molecules therein. This approach may provide faster operation, ease of integration, and/or greater endurance and/or stability. The use of an AlN dielectric layer is provided as an example, and any of a number of high-K dielectric materials that satisfy the parameters discussed above can be employed. In addition, any of a number of metals currently used in semiconductor technology may be used to form the conductive gate. Also, the substrate to which the molecules attach can be semiconductors, dielectrics, metals, and/or metal nitrides.

Figure 13:
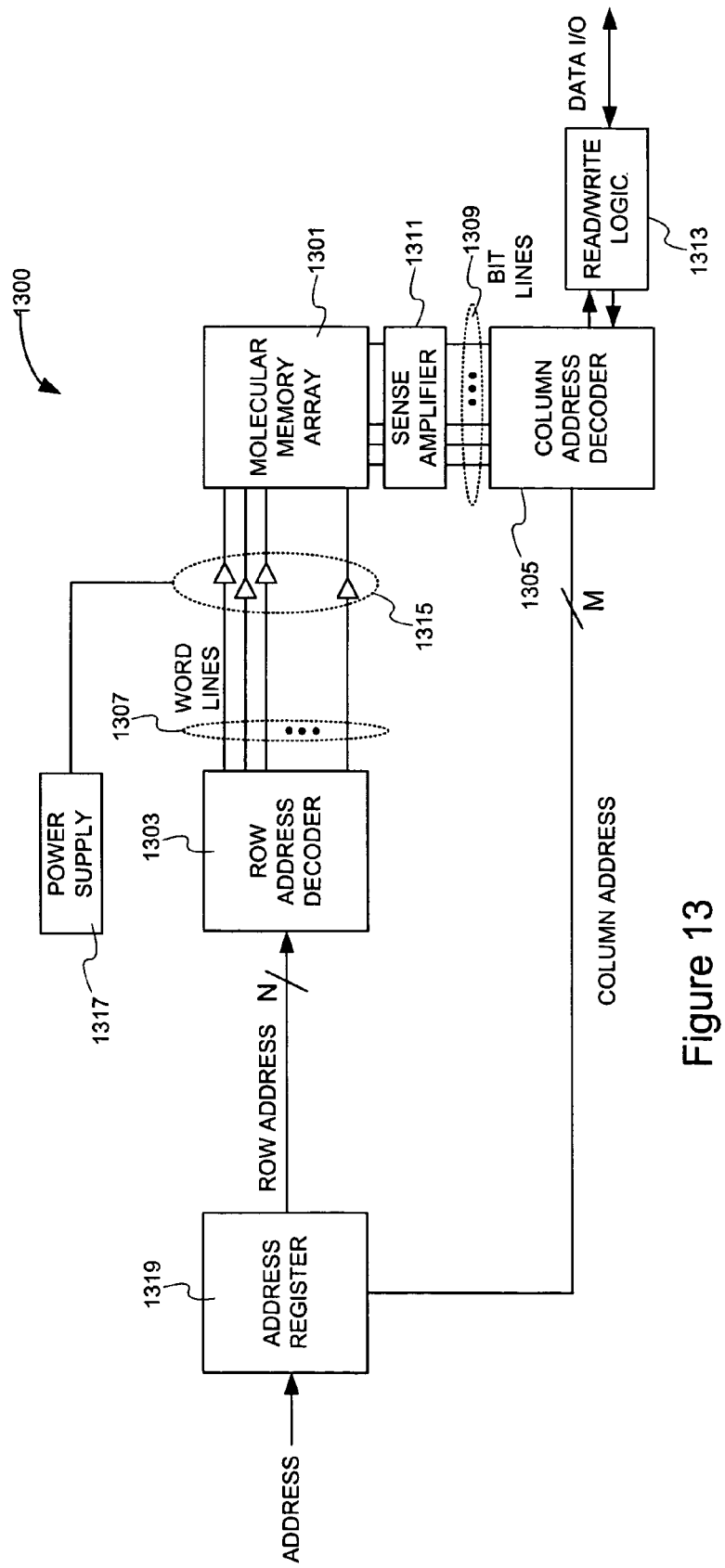
FIG. 13 is a schematic block diagram of a molecular memory incorporating a molecular memory array in accordance with some embodiments.

FIG. 13 is a schematic block diagram of a molecular memory 1300 incorporating a molecular memory array 1301 in accordance with some embodiments. In some embodiments, molecular memory array 1301 comprises an array of 2N rows and 2M columns. Each of the 2N rows is associated with a word line 1307, while each of the 2M columns is associated with a bit line 1309. In a typical application the word lines 1307 and bit lines 1309 will cross over or under each other. The location at which a word line and bit line cross is sometimes called an "intersection," even though the word line and bit line are not connected to each other. A molecular memory cell 1500 (FIG. 15) is typically located at or near the intersection of each row and column. Molecular memory array 1301 may include any number of molecular memory cells 1500 arranged in any fashion that meets the needs of a particular application.

Memory 1300 is operated by receiving an address into address register 1319, which sends an N-bit row address into row address decoder 1303 and an M-bit column address into column address decoder 1305. Row address decoder 1303 generates a signal on one word line 1307. Word lines 1307 may include word line driver circuitry 1315 that drives a high current signal onto word lines 1307. Because word lines 1307 tend to be long, thin conductors that stretch across much of the chip surface, it requires significant current and large power switches to drive a word line signal. As a result, line driver circuits 1315 are often provided with power supply 1317 in addition to power supply circuits (not shown) that provide operating power for the other logic. Word line drivers 1315, therefore, tend to involve large components. The high speed switching of large currents tends to create noise, stress the limits of power supplies and power regulators, and stress isolation structures.

In a conventional memory array there are often more columns (bit lines) than rows (word lines) because during refresh operations, each word line is activated to refresh all storage elements coupled to that word line. Accordingly, the fewer the number of rows, the less time it takes to refresh all of the rows. In some embodiments, molecular memory cell 1500 can be configured to exhibit significantly longer data retention than typical capacitors, on the order of tens, hundreds, or thousands of seconds. Hence, the refresh cycle can be performed much less frequently (e.g., up to orders of magnitude less frequently) or omitted altogether. Accordingly, refresh considerations that actually affect the physical layout of a memory array can be relaxed and arrays of various geometries can be implemented. For example, molecular memory array 1301 can readily be manufactured with a larger number of word lines 1307, which will make each word line shorter. As a result, word line driver circuits 1315 can be made smaller or eliminated because less current is required to drive each word line at a high speed. Alternatively or in addition, shorter word lines 1307 can be driven faster to improve read/write access times. As yet another alternative, each row of memory locations can be provided with multiple word lines to provide a mechanism for storing multiple states of information in each memory location.

Sense amplifiers 1311 are coupled to each bit line 1309 and operate to detect signals on bit lines 1309 that indicate the state of a memory cell 1500 coupled to that bit line, and amplify that state to an appropriate logic level signal. In one embodiment, sense amplifiers 1311 may be implemented with substantially conventional designs as such conventional designs will operate to detect and amplify signals from a molecular memory cell 1500. Alternatively, unlike conventional capacitors, some molecular memory devices provide very distinct signals indicating their state.

Read/write logic 1313 includes circuitry for placing the memory 1300 in a read or write state. In a read state, data from molecular array 1301 is placed on bit lines 1309 (with or without, but typically with the operation of sense amplifiers 1311), and captured by buffers/latches in read/write logic 1313. Column address decoder 1305 will select which bit lines 1309 are active in a particular read operation. In a write operation, read/write logic 1313 drives data signals onto the selected bit lines 1309 such that when a word line is activated, that data overwrites any data already stored in the addressed memory element(s) 1500.

A refresh operation is substantially similar to a read operation; however, the word lines 1307 are driven by refresh circuitry (not shown) rather than by externally applied addresses. In a refresh operation, sense amplifiers 1311, if used, drive the bit lines 1309 to signal levels indicating the current state of the memory elements 1500 and that value is automatically written back to the memory elements 1500. Unlike a read operation, the state of bit lines 1309 is not coupled to read/write logic 1313 during a refresh. The refresh operation is only required if the charge retention time of the molecules used is less than the operational life of the device used, for example, on the order of 10 years for flash memory.

Figure 14:
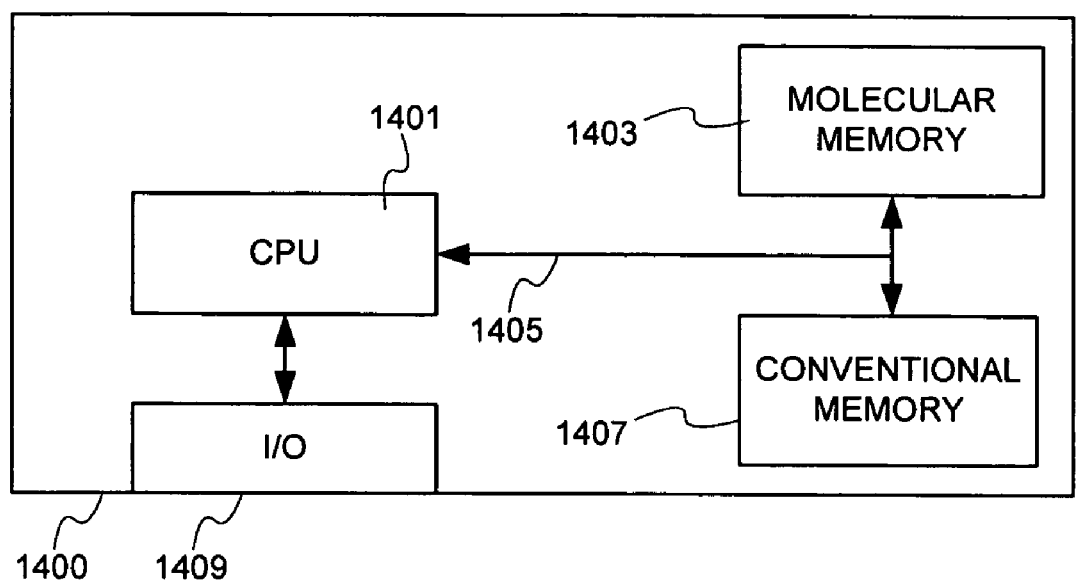
FIG. 14 is a schematic block diagram of a system on a chip (SOC) with embedded molecular memory in accordance with some embodiments.

FIG. 14 is a schematic block diagram of a system on a chip (SOC) with embedded molecular memory in accordance with some embodiments.

SOC 1400 comprises a central processing unit 1401 and molecular memory 1403. A memory bus 1405 couples CPU 1401 and molecular memory 1403 to exchange address, data, and control signals. Optionally, SOC 1400 may also contain conventional memory 1407 coupled to memory bus 1405. Conventional memory 1407 may include random access memory (e.g., DRAM, SRAM, SDRAM and the like), or read only memory (e.g., ROM, EPROM, EEPROM and the like). SOC 1400 can include a memory controller (not shown) in addition to a memory bus 1405 for coupling the CPU 1401 to the molecular memory 1403 and any other memory devices included in the SOC 1400. SOC 1400 may include one or more input/output (I/O) interfaces 1409 that enable CPU 1401 to communicate with external devices and systems. I/O interface 1409 may be implemented by serial ports, parallel ports, radio frequency ports, optical ports, infrared ports and the like. Further, interface 1409 may be configured to communicate using any available protocol, including packet-based protocols. As is well known in the art, a SOC can be incorporated and used in a wide variety of computing devices, including, without limitation, laptop computers, personal digital assistants (PDAs), cell phones, digital cameras and camcorders, embedded computers, and the like. Molecular memory 1300 by itself or molecular memory 1403 embedded in a SOC 1400 can be readily incorporated and used in such computing devices, too.

Figure 15:
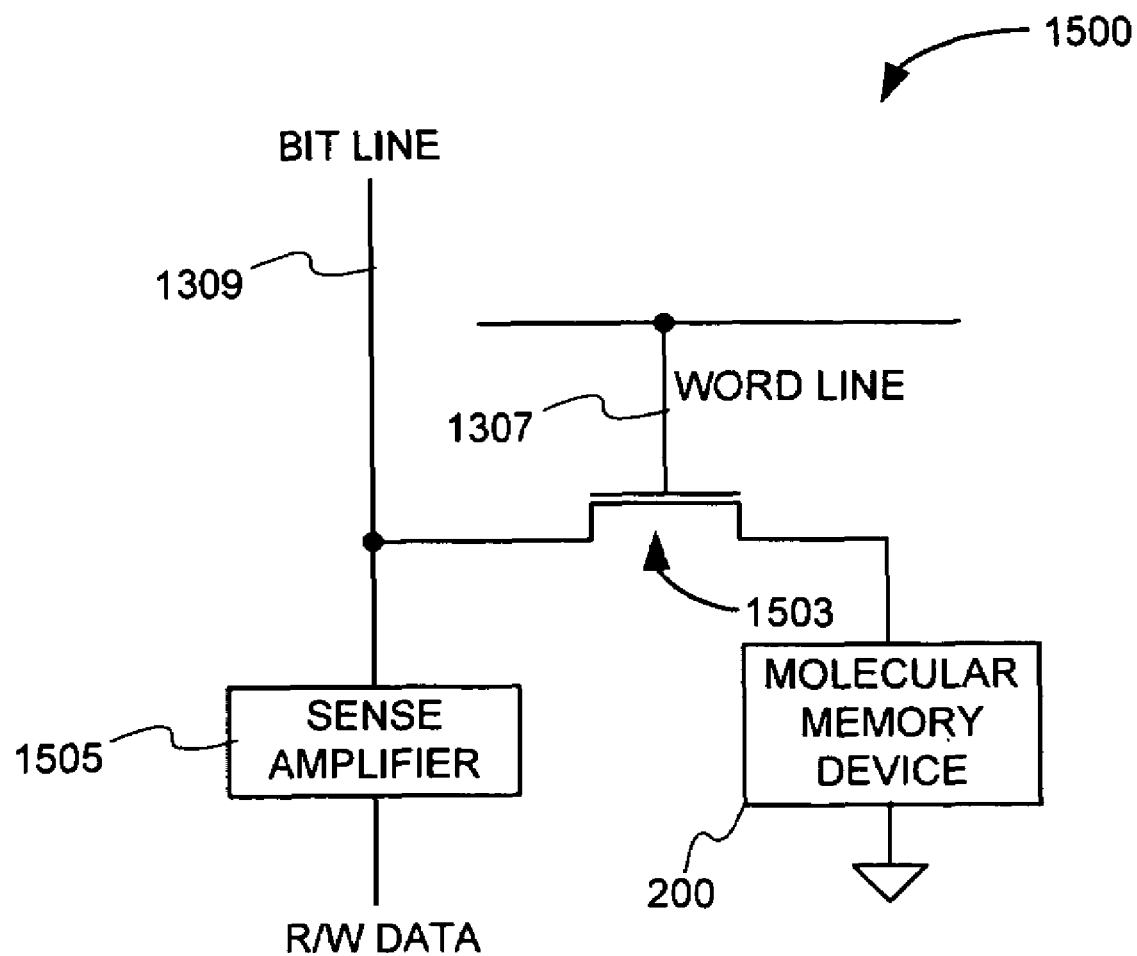
FIG. 15 is a schematic circuit diagram of a memory cell in accordance with some embodiments.

FIG. 15 is a schematic circuit diagram of a memory cell 1500 in accordance with some embodiments. Memory cell 1500 is akin to a widely used one transistor one capacitor (1T1C) memory cell design. However, cell 1500 differs in that a molecular memory device 200, is employed rather than a conventional capacitor. Molecular memory device 200 is present at a multiplicity of distinct locations. The multiplicity of molecular memory devices 200 are used to store information. In some embodiments, data is stored by applying a voltage across molecular memory device 200 at sufficient current to set an oxidation state of charge storage molecules in device 200. In some embodiments, the applied voltage ranges up to about 2 volts. In some embodiments, the applied voltage is the output of an integrated circuit component (e.g., a transistor). In some embodiments, the applied voltage is the output of a logic gate.

In some embodiments, the molecular memory device 200 is implemented as a structure formed subsequent to and above a semiconductor substrate having active devices formed therein. The molecular memory device 200 is fabricated using processing techniques that are compatible with the semiconductor substrate and previously formed active devices in the semiconductor substrate.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An article of manufacture, comprising:
  a substrate;
  a molecular layer on the substrate comprising at least one charge storage molecule coupled to the substrate by a molecular linker, wherein the at least one charge storage molecule comprises a redox active molecule;
  a solid barrier dielectric layer directly on the molecular layer; and
  a conductive layer directly on the solid barrier dielectric layer, wherein:
    the solid barrier dielectric layer is configured to provide a voltage drop across the molecular layer that is greater than a voltage drop across the solid barrier dielectric layer when a voltage is applied to the conductive gate;
    the solid barrier dielectric layer has a greater dielectric constant than the molecular layer;
    the molecular layer has a thickness greater than that of the solid barrier dielectric layer; and
    the article of manufacture contains no electrolyte between the molecular layer and the conductive layer.

2. An article of manufacture, comprising:
  a substrate;
  a molecular layer on the substrate comprising at least one charge storage molecule coupled to the substrate by a molecular linker;
  a solid barrier dielectric layer directly on the molecular layer; and
  a conductive layer directly on the solid barrier dielectric layer, wherein:
    the molecular layer has a thickness greater than that of the solid barrier dielectric layer; and
    the article of manufacture contains no electrolyte between the molecular layer and the conductive layer.

3. The article of manufacture of claim 2, wherein the substrate comprises a semiconductor, a dielectric, a metal, and/or a metal nitride.

4. The article of manufacture of claim 2, wherein the substrate comprises a metal nitride.

5. The article of manufacture of claim 2, wherein the substrate comprises titanium nitride.

6. The article of manufacture of claim 2, wherein the at least one charge storage molecule comprises at least one redox active molecule.

7. The article of manufacture of claim 2, wherein the at least one charge storage molecule comprises a porphyrin molecule and/or a ferrocene molecule.

8. The article of manufacture of claim 2, wherein the at least one charge storage molecule is configured to store a fixed charge therein and discharge the fixed charge therefrom responsive to a voltage applied thereto.

9. The article of manufacture of claim 2, wherein the solid barrier dielectric layer is configured to provide a voltage drop across the molecular layer that is greater than a voltage drop across the solid barrier dielectric layer when a voltage is applied to the conductive gate.

10. The article of manufacture of claim 2, wherein the solid barrier dielectric layer has a band gap of 6 eV or more.

11. The article of manufacture of claim 2, wherein the molecular layer has a dielectric constant of about 2.5, and wherein the solid barrier dielectric layer has a dielectric constant of 8.5 or more.

12. The article of manufacture of claim 2, wherein the solid barrier dielectric layer comprises aluminum oxide ($Al_2O_3$), aluminum nitride (AlN), cobalt titanium oxide ($CoTiO_3$), nickel titanium oxide ($NiTiO_3$), hafnium oxide ($HfO_2$), and/or titanium oxide ($TiO_2$).

13. The article of manufacture of claim 2, wherein the solid barrier dielectric layer comprises $HfAl_xO_y$, $HfSi_xO_y$, $ZrAl_xO_y$, $ZrSi_xO_y$, $LaAl_xO_y$, $La_2O_3$, $Ta_2O_5$, $TaO_xN_y$, $SrTiO_x$, barium strontium titanate, perovskites, and/or derivatives thereof.

14. The article of manufacture of claim 2, wherein the solid barrier dielectric layer comprises a layered structure.

15. The article of manufacture of claim 2, wherein the solid barrier dielectric layer comprises a layered structure of $HfO_2$—$Al_2O_3$—$HfO_2$, $Al_2O_3$—$HfO_2$, $Ta_2O_5$—$HfO_2$, $HfO_2$—$Nb_2O_5$, or $ZrO_2$—$Al_2O_3$—$ZrO_2$.

16. The article of manufacture of claim 2, wherein the solid barrier dielectric layer comprises aluminum nitride (AlN).

17. The article of manufacture of claim 2, wherein the solid barrier dielectric layer comprises hafnium oxide ($HfO_2$).

18. The article of manufacture of claim 2, wherein the solid barrier dielectric layer comprises zirconium oxide ($ZrO_2$) and derivatives thereof.

19. The article of manufacture of claim 2, wherein the solid barrier dielectric layer has a greater dielectric constant than the molecular layer.

20. The article of manufacture of claim 2, wherein the solid barrier dielectric layer has a thickness of about 50 Å, and wherein the molecular layer has a thickness of about 200 Å.

21. The article of manufacture of claim 2, wherein the solid barrier dielectric layer is sufficiently thick to substantially inhibit leakage current between the conductive gate and the molecular layer.

22. The article of manufacture of claim 2, wherein the electrical leakage is less than 1E-6 $A/cm^2$.

23. The article of manufacture of claim 2, wherein the electrical leakage is less than 1E-7 $A/cm^2$.

24. The article of manufacture of claim 2, wherein the electrical leakage is less than 1E-8 $A/cm^2$.

25. The article of manufacture of claim 2, wherein the solid barrier dielectric layer and the molecular linker are configured to act as a screening medium for charge stored in the at least one charge storage molecule.

26. The article of manufacture of claim 2, wherein the conductive layer comprises aluminum.

27. The article of manufacture of claim 2, wherein the conductive layer comprises titanium nitride.

28. The article of manufacture of claim 2, wherein the conductive layer comprises Ru, W, Pt, Mo, WN, MoN, $RuO_2$, $IrO_x$, Re, Os, or TaN.

29. The article of manufacture of claim 2, wherein the article of manufacture contains no electrolyte.

30. The article of manufacture of claim 2, wherein the article of manufacture comprises a memory device.

31. An electronic device wherein the article of manufacture of claim 2 is present at a multiplicity of distinct locations.

32. The electronic device of claim 31 wherein the multiplicity of articles of manufacture of claim 2 are used to store information.

33. A method of storing data, comprising:
providing an article of manufacture according to claim 2; and
applying a voltage across the article at sufficient current to set an oxidation state of charge storage molecules in the article.

34. The method of claim 33, wherein the voltage ranges up to about 2 volts.

35. The method of claim 33, wherein the voltage is the output of an integrated circuit component.

36. The method of claim 33, wherein the voltage is the output of a logic gate.

37. An article of manufacture, comprising:
a substrate;
a molecular layer on the substrate comprising at least one charge storage molecule coupled to the substrate by a molecular linker;
a solid barrier dielectric layer directly on the molecular layer; and
a conductive layer directly on the solid barrier dielectric layer, wherein:
the solid barrier dielectric layer is configured to provide a voltage drop across the molecular layer that is greater than a voltage drop across the solid barrier dielectric layer when a voltage is applied to the conductive gate; and
the article of manufacture contains no electrolyte between the molecular layer and the conductive layer.

38. A method, comprising:
forming a molecular layer with at least one charge storage molecule on a substrate wherein the at least one charge storage molecule is coupled to the substrate by a molecular linker;
forming a solid barrier dielectric layer directly on the molecular layer; and
forming a conductive layer directly on the solid barrier dielectric layer, wherein:
the molecular layer has a thickness greater than that of the solid barrier dielectric layer; and
there is no electrolyte between the molecular layer and the conductive layer.

39. The method of claim 38, wherein forming the molecular layer comprises liquid dispensing of charge storage molecules in a solvent via a spin/bake process.

40. The method of claim 38, wherein the at least one charge storage molecule is a redox active molecule.

41. The method of claim 38, wherein forming the solid barrier dielectric layer comprises atomic layer deposition of the solid barrier dielectric layer.

42. The method of claim 38, wherein forming the conductive layer comprises evaporation, physical vapor deposition, chemical vapor deposition, or atomic layer deposition of the conductive layer.

43. A method, comprising:
forming a molecular layer with at least one charge storage molecule on a substrate wherein the at least one charge storage molecule is coupled to the substrate by a molecular linker;
forming a solid barrier dielectric layer directly on the molecular layer; and
forming a conductive layer directly on the solid barrier dielectric layer, wherein:

the solid barrier dielectric layer is configured to provide a voltage drop across the molecular layer that is greater than a voltage drop across the solid barrier dielectric layer when a voltage is applied to the conductive layer; and there is no electrolyte between the molecular layer and the conductive layer.

* * * * *

UNITED STATES PATENT AND TRADEMARK OFFICE
CERTIFICATE OF CORRECTION

PATENT NO. : 7,642,546 B2  Page 1 of 1
APPLICATION NO. : 11/607503
DATED : January 5, 2010
INVENTOR(S) : Misra et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 456 days.

Signed and Sealed this

Sixteenth Day of November, 2010

David J. Kappos
*Director of the United States Patent and Trademark Office*